(12) United States Patent
Lam et al.

(10) Patent No.: US 8,815,718 B1
(45) Date of Patent: Aug. 26, 2014

(54) VERTICAL SURROUND GATE FORMATION COMPATIBLE WITH CMOS INTEGRATION

(71) Applicant: International Business Machines Corporation, Armonk, NY (US)

(72) Inventors: Chung H. Lam, Peekskill, NY (US); Jing Li, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/931,803

(22) Filed: Jun. 28, 2013

(51) Int. Cl.
*H01L 21/28* (2006.01)
*H01L 21/336* (2006.01)

(52) U.S. Cl.
USPC ........... 438/489; 438/211; 438/267; 438/586; 438/591; 571/234; 571/E21.179; 571/E29.262

(58) Field of Classification Search
USPC ................. 438/211, 267, 257, 586, 589, 591
See application file for complete search history.

(56) References Cited

U.S. PATENT DOCUMENTS

| | | | | |
|---|---|---|---|---|
| 7,592,225 B2 * | 9/2009 | Kai et al. | | 438/261 |
| 8,637,389 B2 * | 1/2014 | Chen et al. | | 438/587 |
| 2009/0163008 A1 * | 6/2009 | Purayath et al. | | 438/586 |
| 2012/0217570 A1 * | 8/2012 | Kim | | 257/324 |

* cited by examiner

*Primary Examiner* — Mamadou Diallo
(74) *Attorney, Agent, or Firm* — Ido Tuchman; Louis J. Percello

(57) ABSTRACT

A method for fabricating vertical surround gates in a semiconductor device array structure such that the processes are compatible with CMOS fabrication. The array structure includes a CMOS region and an array region. The method includes forming a polish stop layer, a plurality of patterning layers, a CMOS layer over a substrate, array pillars and array trenches. Forming the array pillars and trenches includes removing the CMOS cover layer and patterning layers. The method further includes doping portions of the substrate within the array trenches. The method includes forming vertical surround gates in the array trenches, an array filler layer to fill in the array trenches, and a CMOS photoresist pattern over the array filler layer. The method includes etching the CMOS trenches down through a portion of the substrate, such that the array pillars under the shared trench are etched to form contact holes.

15 Claims, 23 Drawing Sheets

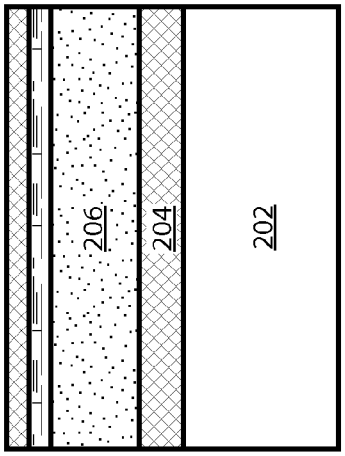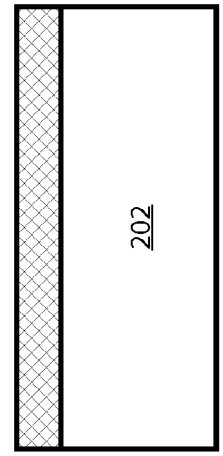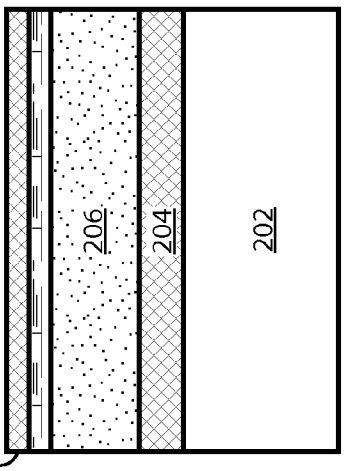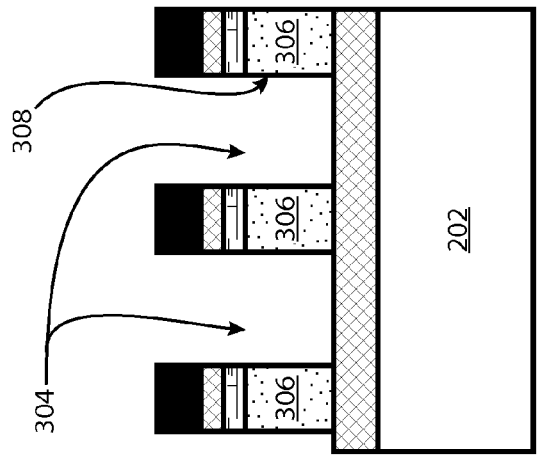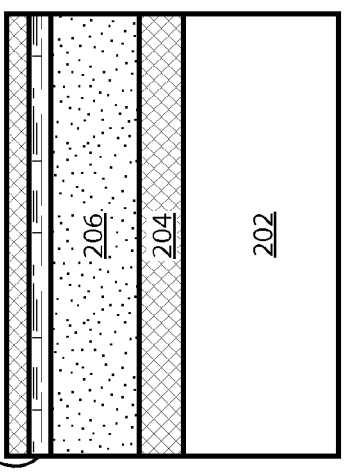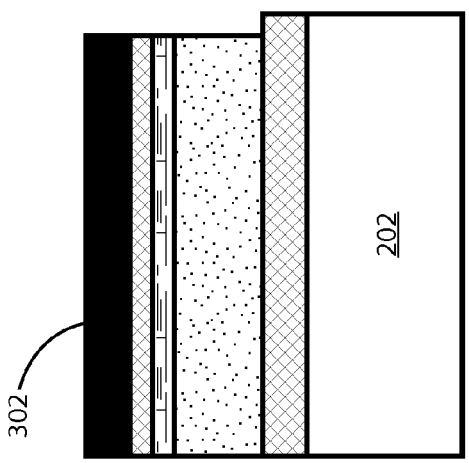

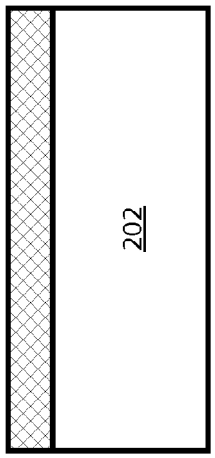
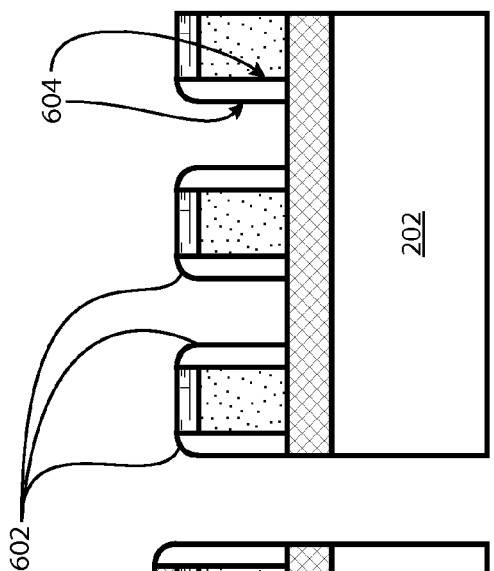
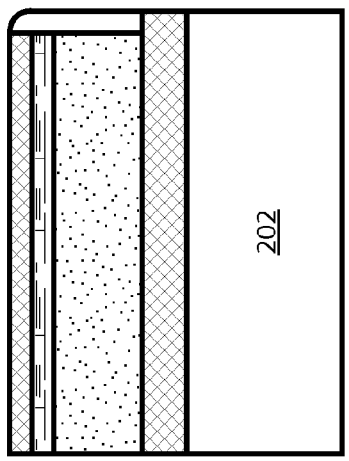
FIG. 6A  FIG. 6B  FIG. 6C
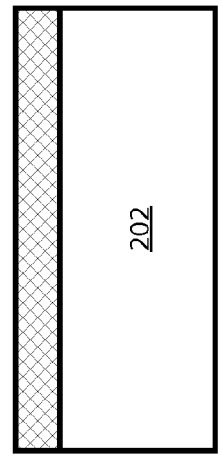
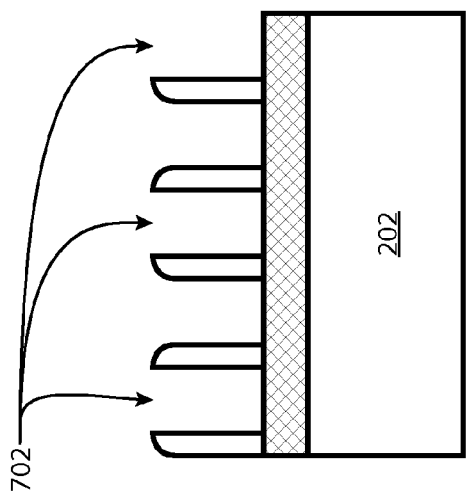
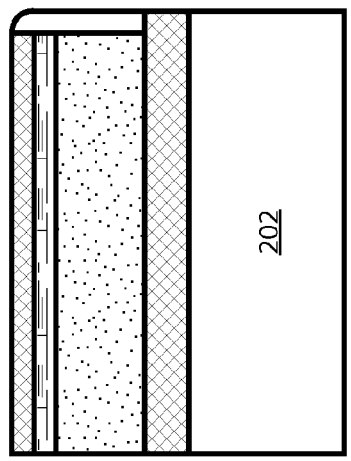
FIG. 7A  FIG. 7B  FIG. 7C

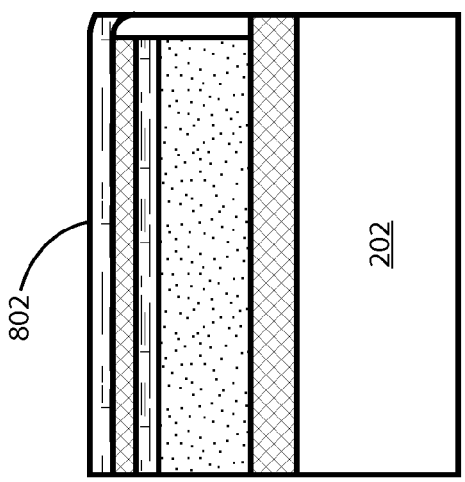
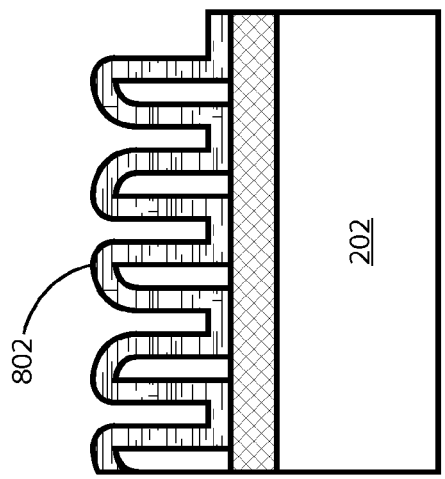
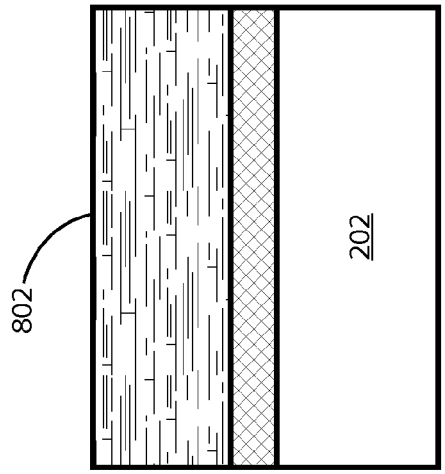
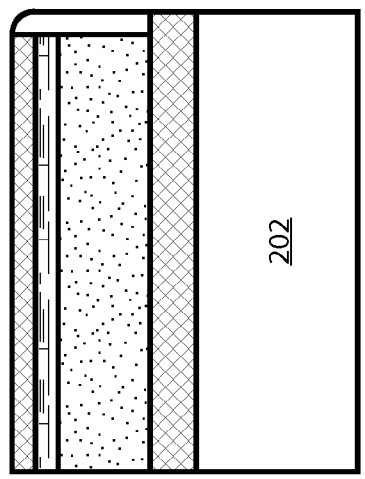
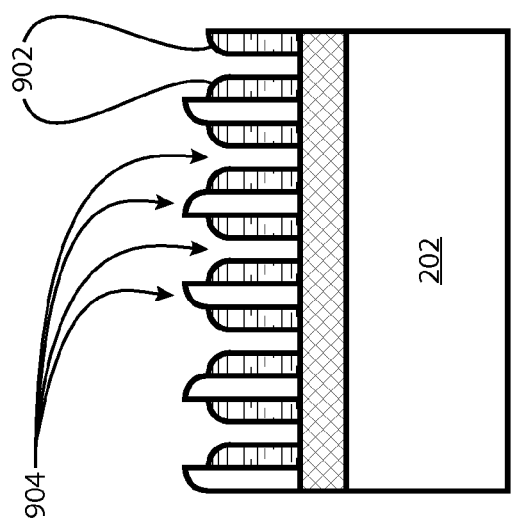
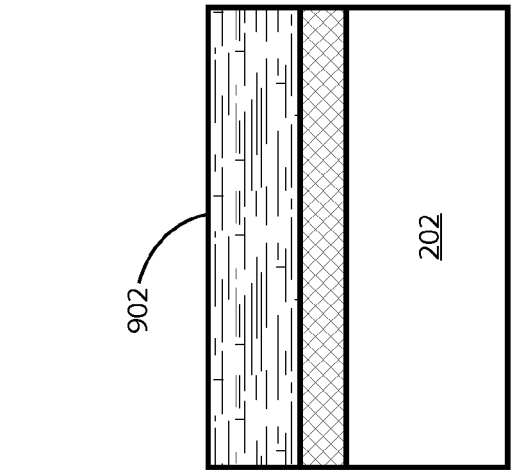

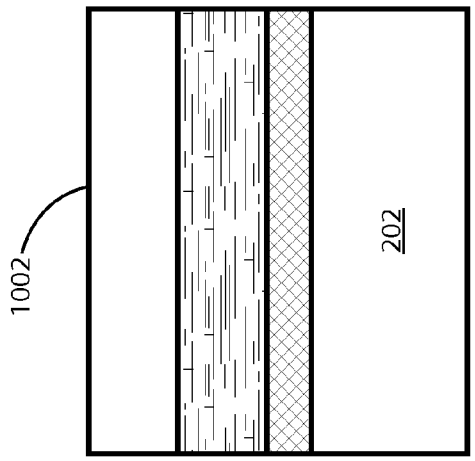
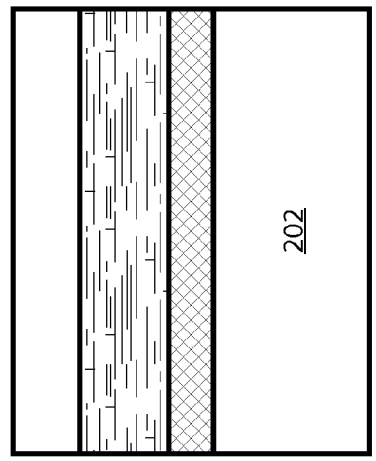
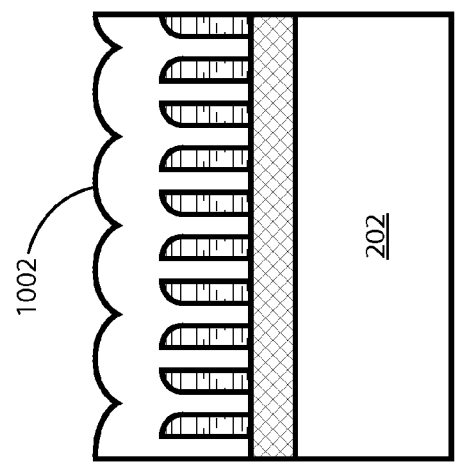
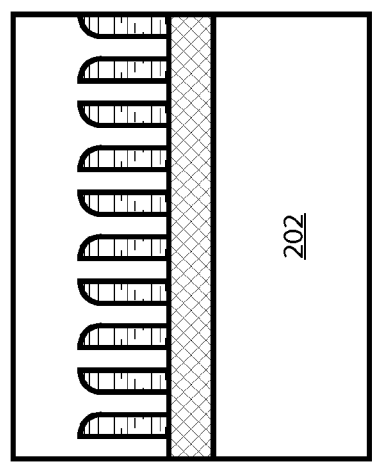
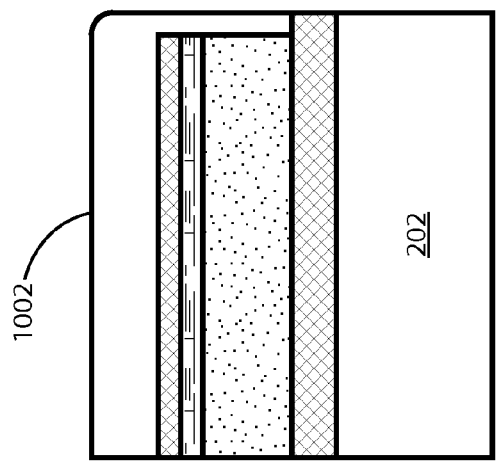
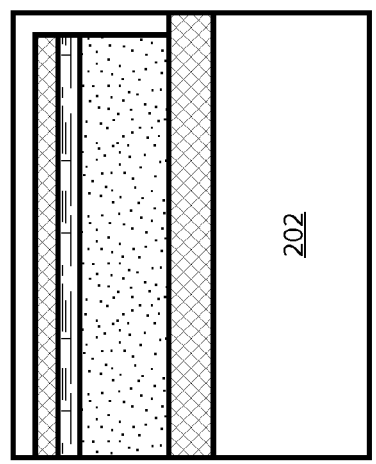

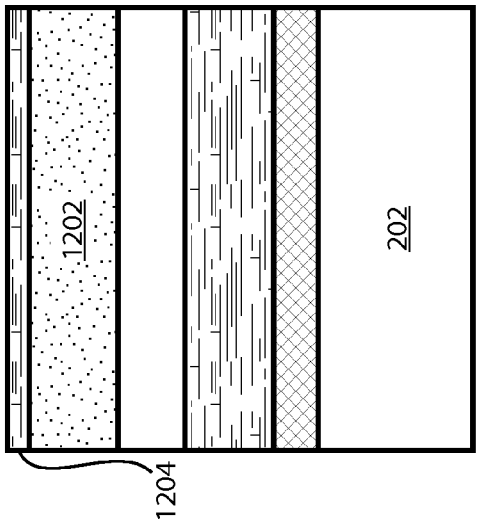
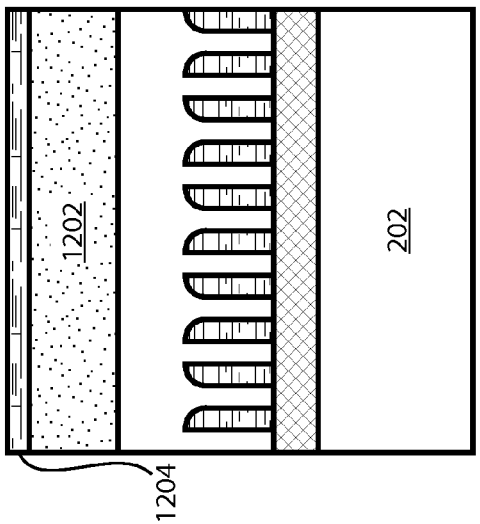
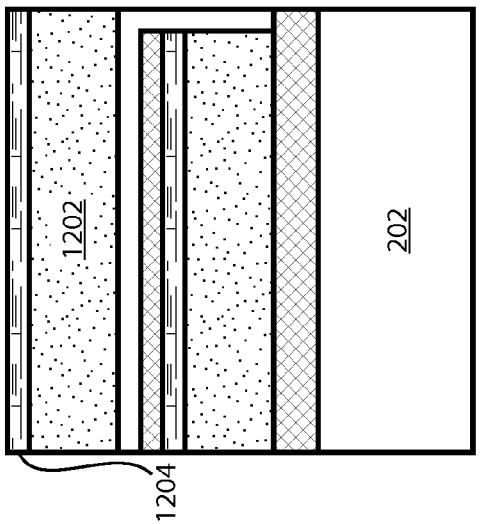
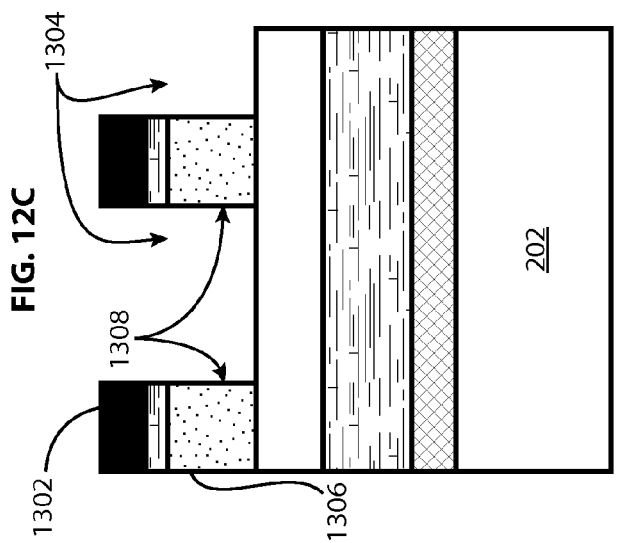
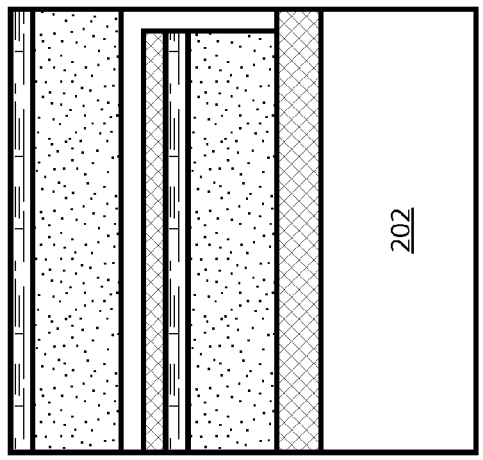

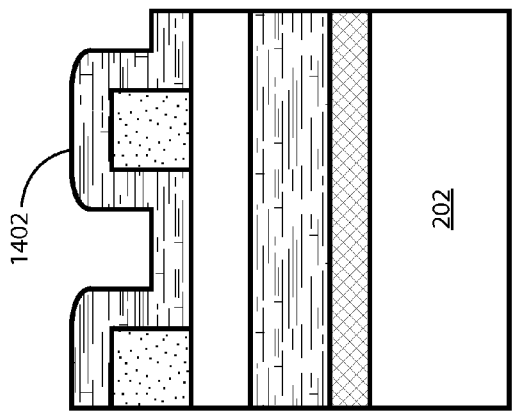
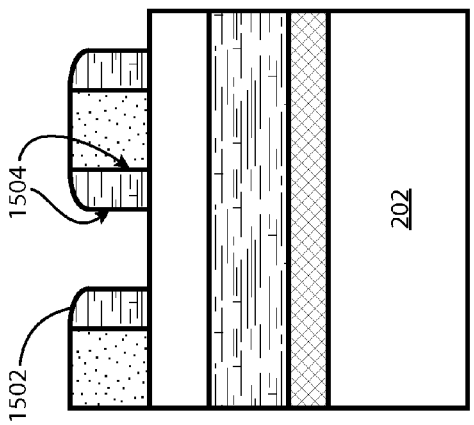
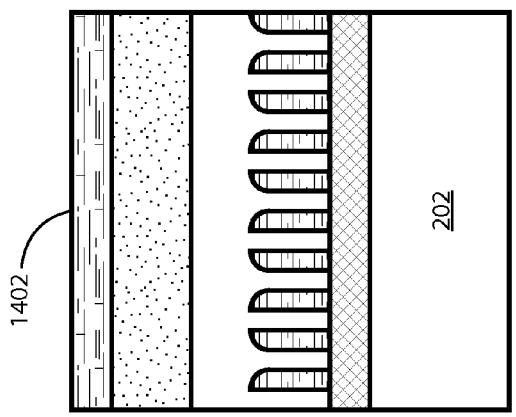
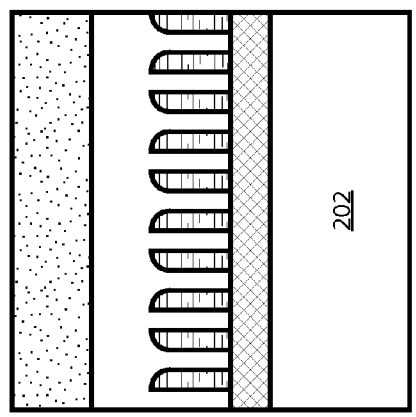
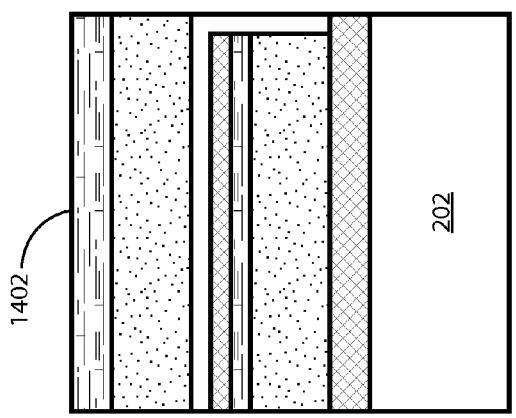
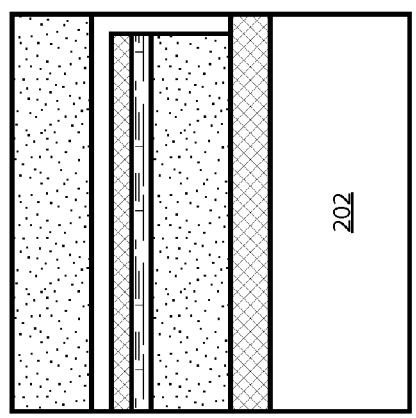

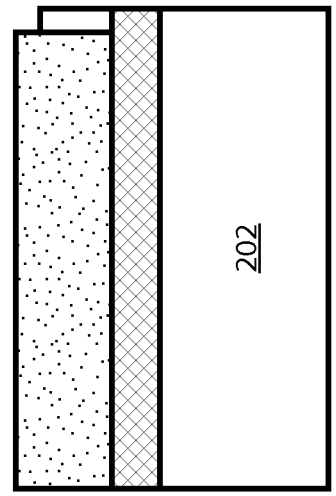
FIG. 22A
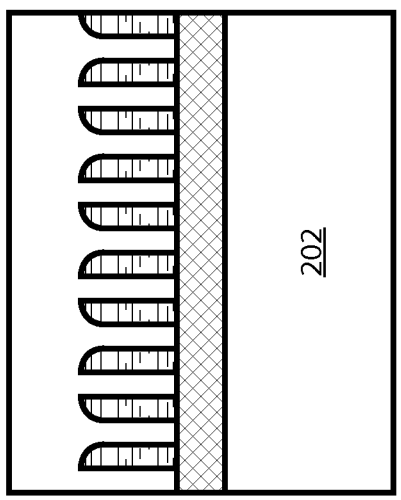
FIG. 22B
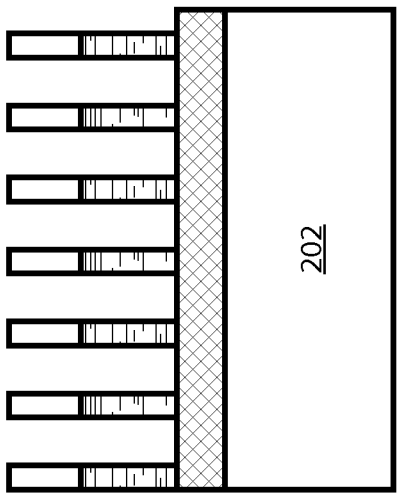
FIG. 22C
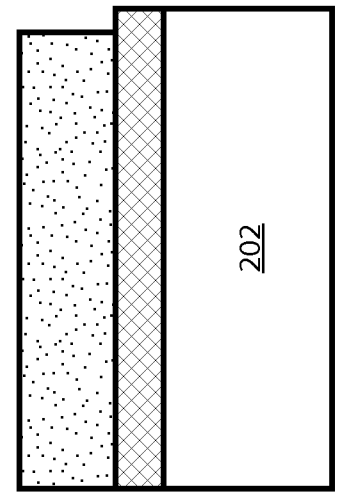
FIG. 23A
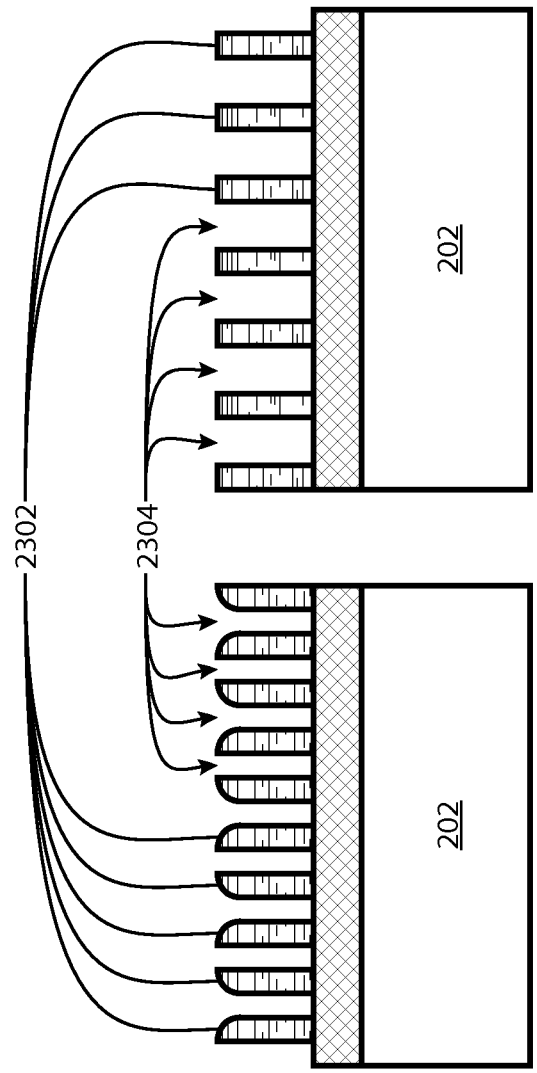
FIG. 23B
FIG. 23C

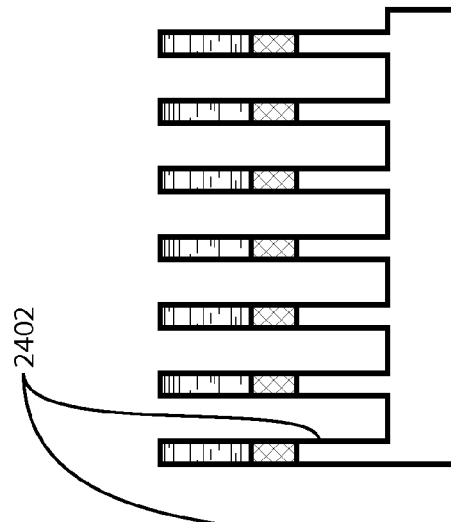
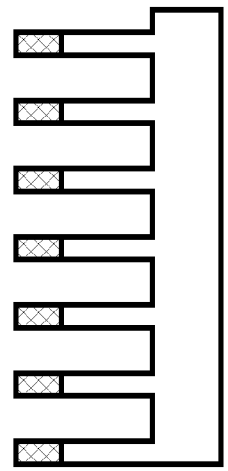
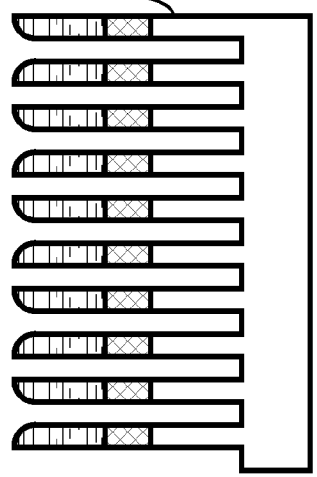
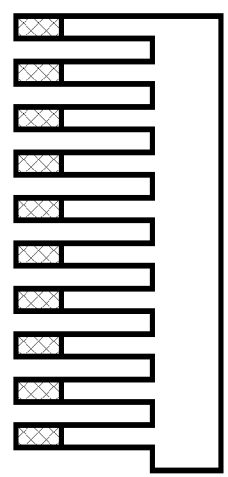
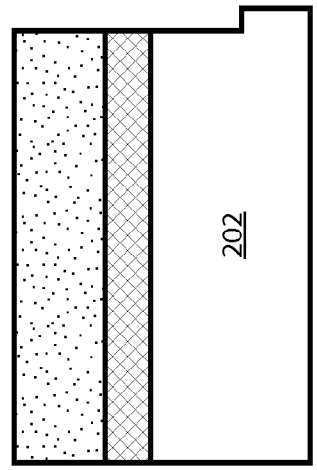
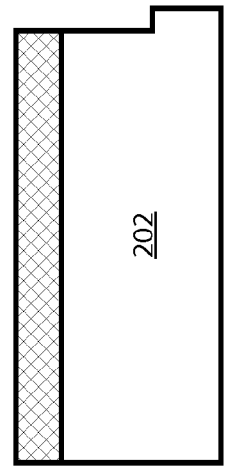

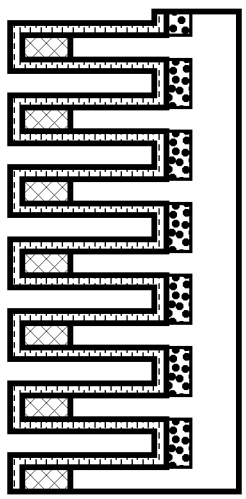
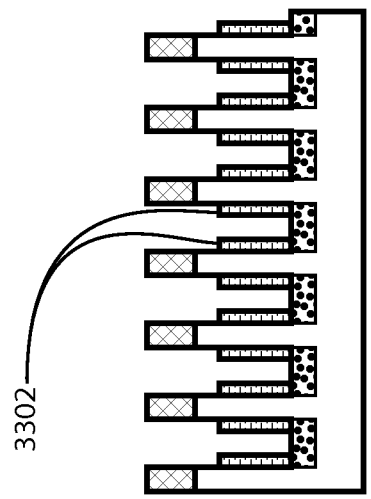
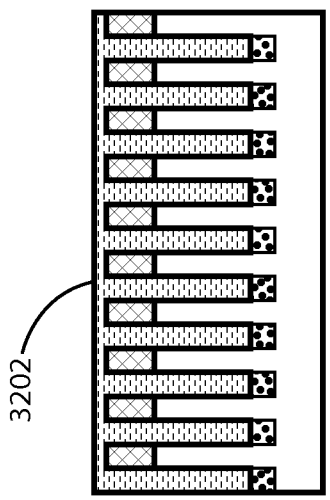
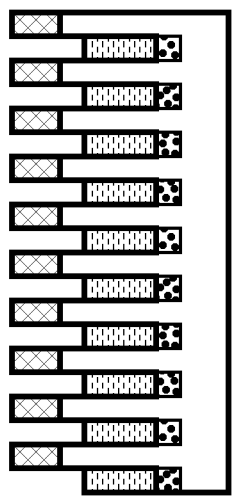
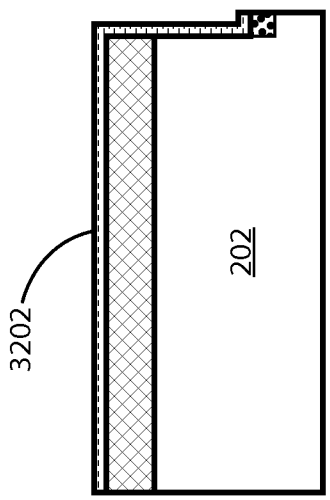
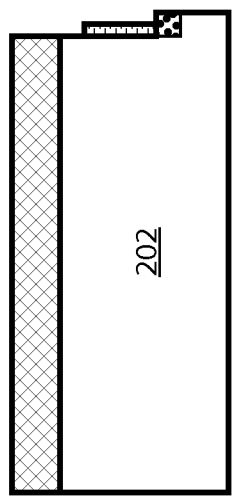

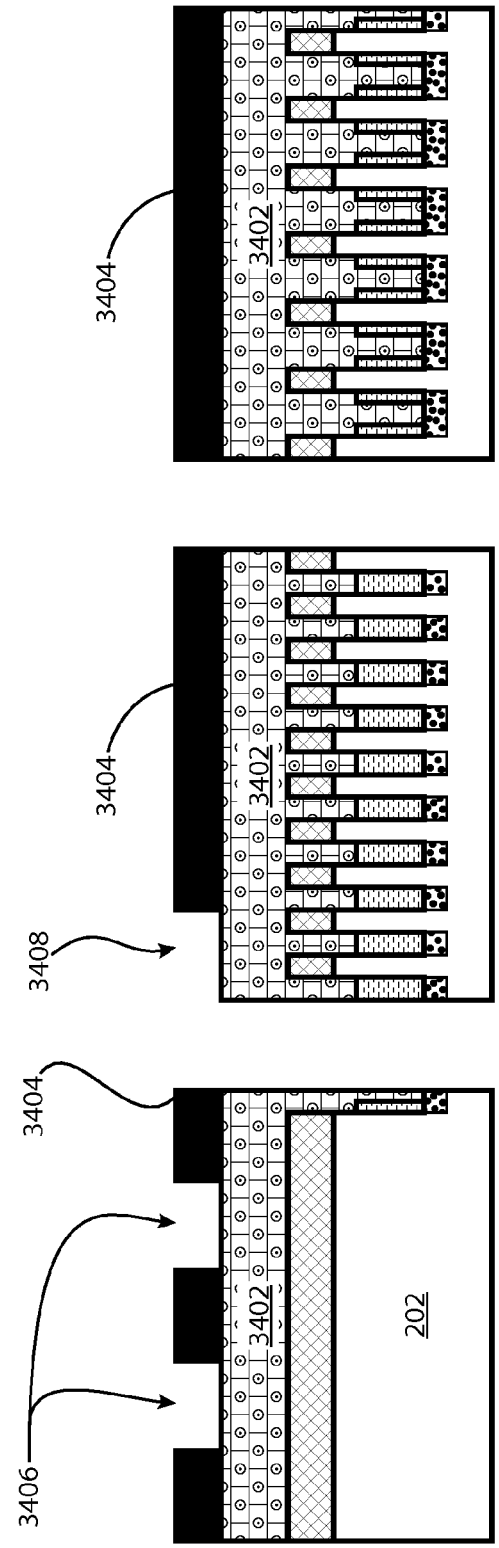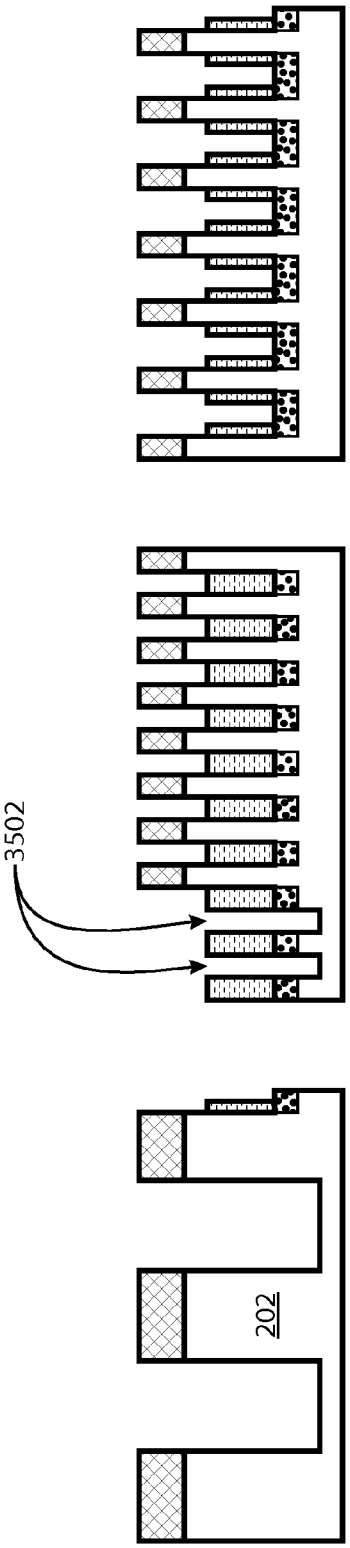

VERTICAL SURROUND GATE FORMATION COMPATIBLE WITH CMOS INTEGRATION

BACKGROUND

This invention relates to the fabrication of semiconductor devices. More particularly, the present invention relates to a method for fabricating vertical surround gate structures in a semiconductor device array.

In semiconductor device applications, conventional planar transistors have the most mature integration process. However, in memory applications, particularly access devices (or selectors), reduction of device footprint is essential to improve memory density. Planar transistor performance is generally restricted by channel width and length. Reducing channel width or length can improve memory density at the cost of degraded device performance.

Vertical surround gate devices have become an attractive design choice for memory applications. In vertical surround gate devices the current flow is oriented in a vertical direction, providing many advantages to area efficiency. However, many current integration processes for vertical surround gate structures are not easily compatible with standard CMOS integration. Specifically, many current applications of double patterning techniques for channel, source, and drain formation are disruptive to the standard CMOS thermal cycle. Additionally, from a cost efficient perspective, it is desirable to integrate the vertical surround gate structures with a minimum number of additional masks.

BRIEF SUMMARY

An aspect of the invention is a method for fabricating vertical surround gate structures in a semiconductor device array such that the processes are compatible with standard CMOS fabrication processes. The semiconductor device array structure includes a CMOS region and an array region. The method includes successively forming a polish stop layer, a plurality of patterning layers, and a CMOS layer over a substrate. The method also includes forming a plurality of array pillars and array trenches such that forming the array pillars and trenches includes removing the CMOS cover layer and patterning layers. The method includes planarizing the polish stop layer. The method also includes doping portions of the substrate within the array trenches. Furthermore, the method includes forming a plurality of vertical surround gates around the array pillars and within the array trenches. The method also includes forming an array filler layer to fill in the array trenches. The method includes forming a CMOS photoresist pattern over the array filler layer. The method also includes etching CMOS trenches in the CMOS photoresist pattern down through a portion of the substrate. The etch also forming a plurality of contact holes in a portion of the substrate.

BRIEF DESCRIPTION OF DRAWINGS

FIGS. 2A through 35C are cross-sectional views of intermediary steps during fabrication of a semiconductor device array structure, in accordance to one embodiment of the present invention.

DETAILED DESCRIPTION

The present invention is described with reference to various embodiments of the invention. Throughout the description of the invention, reference is made to FIG. 1 through FIG. 40.

Additionally, relative terms, such as "vertical", "over", and "down" are employed with respects to other elements in the described embodiments and figures. Such terms are meant only to describe the referenced embodiments. Therefore, the present invention encompasses alternative orientations of the suggested embodiments. Embodiments of the present invention provide possible methods of fabricating semiconductor device features. An aspect of the present invention provides a method of fabricating a semiconductor device array with vertical surround gate structures. Such a method includes a CMOS cover layer which may be utilized to 'protect' the CMOS region while patterning the semiconductor device array. The ideal embodiment includes a polish stop layer which may be utilized for leveling the CMOS region with the array region after patterning the semiconductor device array.

Figure 1:
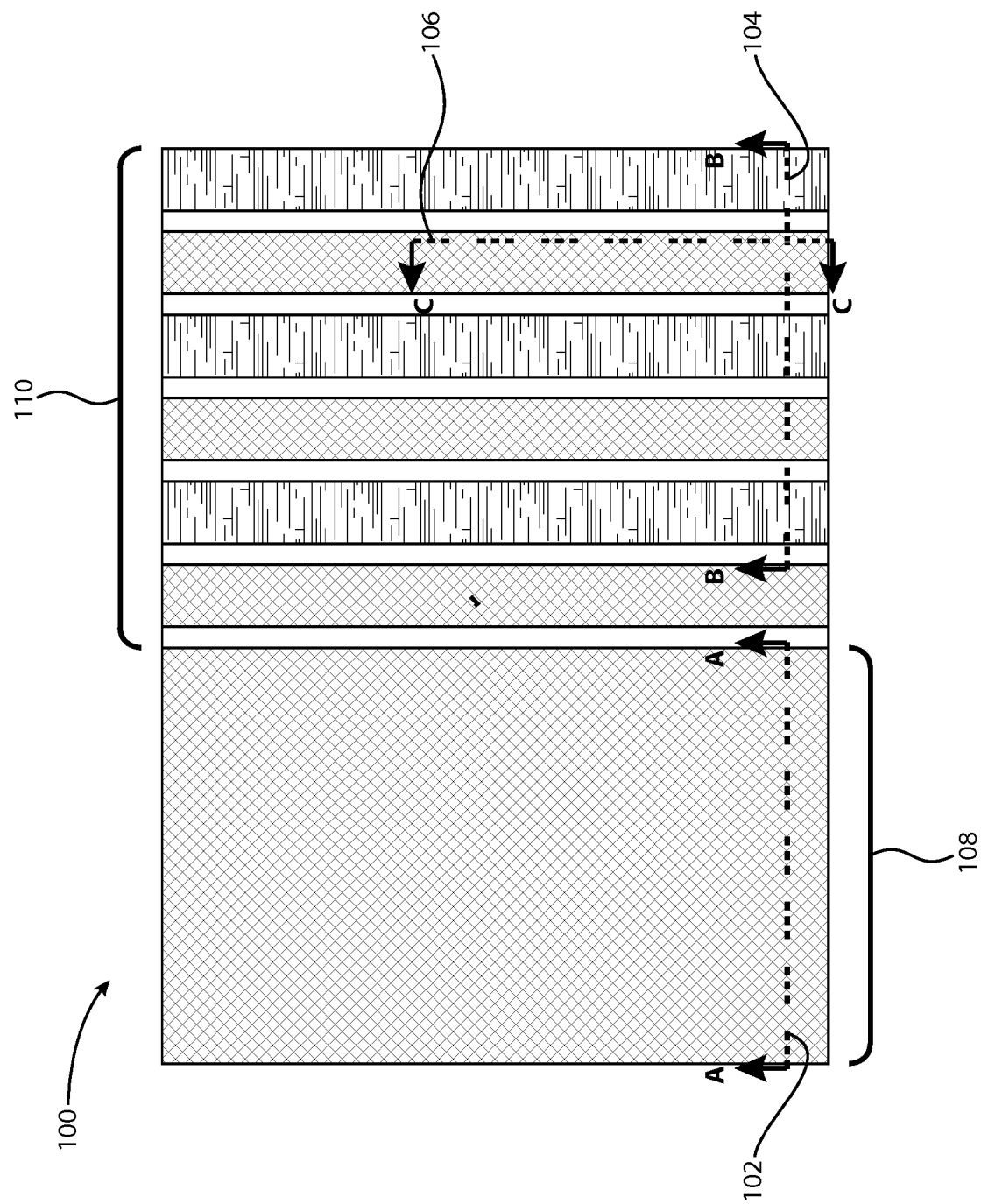
FIG. 1 is a top-down diagram of a semiconductor device array after forming a plurality of first column spacers, in accordance to one embodiment of the present invention.

FIG. 1 depicts a top-down view of a semiconductor device array 100 after forming a plurality of first column spacers, in accordance with one embodiment of the present invention. The diagram includes cross-section A 102, cross-section B 104 and cross-section C 106. In some figures, the cross-sectional view of cross-section C 106 is restricted to a limited depth (i.e., only within a trench). The diagram further depicts semiconductor device array 100 including a CMOS region 108 and an array region 110.

The diagrams from FIGS. 2A through 35C are cross-sectional views of intermediary steps during fabrication of a semiconductor device array 100 structure, in accordance to one embodiment of the present invention.

FIGS. 2A, 2B, and 2C schematically depict semiconductor device array 100 from cross-sections A 102, B 104, and C 106, respectively. FIGS. 2A-2C illustrate semiconductor device array 100 after successively forming a polish stop layer 204, a column advanced patterning layer 206, a column advanced patterning mask 208, and a CMOS cover layer 210, over a substrate 202. In this embodiment, the polish stop layer 204 and CMOS cover layer 210 is composed of a silicon-nitride (SiN) material. The column advanced patterning layer 206 is comprised of a carbon material. The column advanced patterning mask 208 is comprised of a silicon-oxide (SiO) material.

FIGS. 3A, 3B, and 3C schematically depict semiconductor device array 100 from cross-sections A 102, B 104, and C 106, respectively. FIGS. 3A-3C illustrate semiconductor device array 100 after forming a column photoresist pattern 302 over the CMOS cover layer 210, and etching first column trenches 304 down through the column advanced patterning layer 206, the column advanced patterning mask 208, and the CMOS cover layer 210. FIG. 3B further depicts first columns 306, including first column sidewalls 308.

Figure 4A:
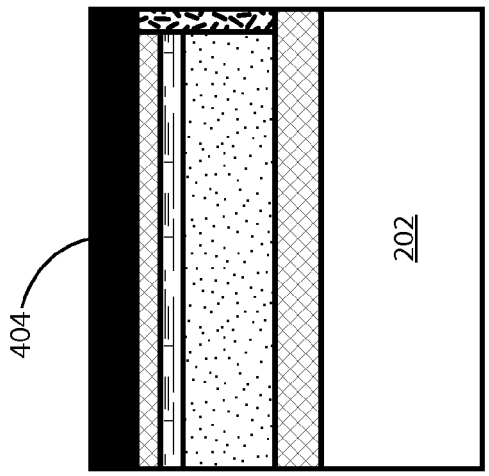
Figure 4B:
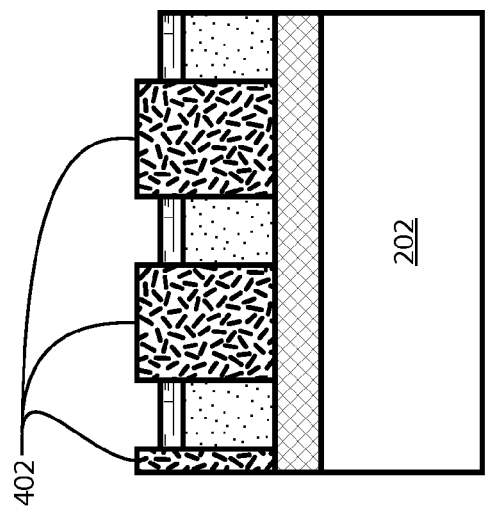
Figure 4C:
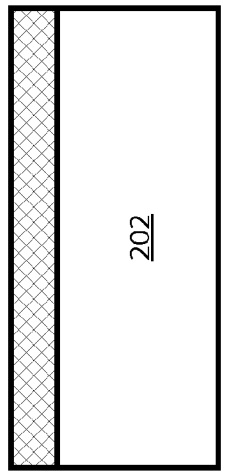

FIGS. 4A, 4B, and 4C schematically depict semiconductor device array 100 from cross-sections A 102, B 104, and C 106, respectively. FIGS. 4A-4C illustrate semiconductor device array 100 after forming a plurality of column trench masks 402 within the first column trenches 304, forming a CMOS mask 404 over the CMOS region 108, and etching the CMOS cover layer 210 within the array region 110. In this embodiment, the column trench masks 402 are composed of a spin-on oxide material, however, it is recognized that a variety of materials can be utilized to fill the first column trenches 304.

Figure 5A:
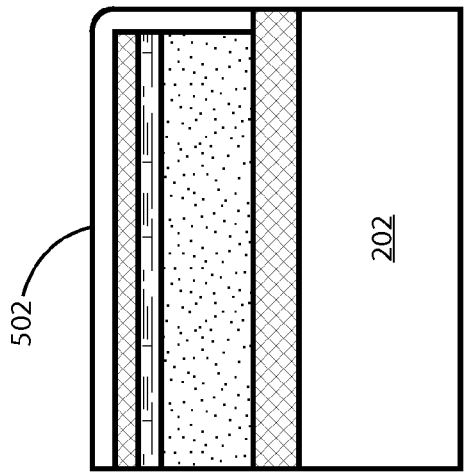
Figure 5B:
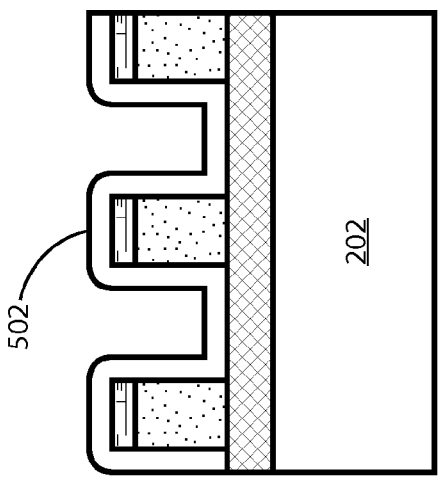
Figure 5C:
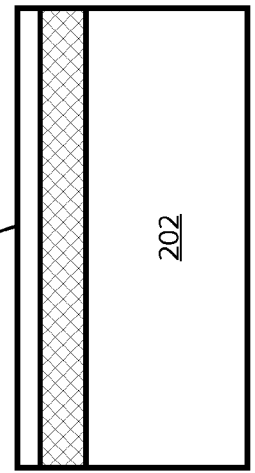

FIGS. 5A, 5B, and 5C schematically depict semiconductor device array 100 from cross-sections A 102, B 104, and C 106, respectively. FIGS. 5A-5C illustrate semiconductor device array 100 after forming a first column spacer layer 502 over the CMOS cover layer 210. In this embodiment, the first column spacer layer 502 is composed of a silicon (Si) material. FIGS. 5B and 5C both depict the same step in fabrication as FIG. 5A, from cross-section B 104 and cross-section C 106, respectively. FIGS. 5B and 5C further depict the first column spacer layer 502 within the first column trenches 304.

FIGS. 6A, 6B, and 6C schematically depict semiconductor device array 100 from cross-sections A 102, B 104, and C 106, respectively. FIGS. 6A-6C illustrate semiconductor device array 100 after etching a portion of the first column spacer layer 502, resulting in a plurality of first column spacers 602, adjacent to the first columns 306. FIG. 6B further depicts the first column spacer sidewalls 604. In this embodiment, each first column sidewall 308 is adjacent to one first column spacer 602.

FIGS. 7A, 7B, and 7C schematically depict semiconductor device array 100 from cross-sections A 102, B 104, and C 106, respectively. FIGS. 7A-7C illustrate semiconductor device array 100 after removing the first columns 306. FIG. 7B further depicts a plurality of second column trenches 702, resulting from the removal of the first columns 306.

FIGS. 8A, 8B, and 8C schematically depict semiconductor device array 100 from cross-sections A 102, B 104, and C 106, respectively. FIGS. 8A-8C illustrate semiconductor device array 100 after forming a hard mask layer 802 over the CMOS cover layer 210, first column spacers 602, and polish stop layer 204. In this embodiment, the hard mask layer 802 is composed of a silicon-oxide (SiO) material.

FIGS. 9A, 9B, and 9C schematically depict semiconductor device array 100 from cross-sections A 102, B 104, and C 106, respectively. FIGS. 9A-9C illustrate semiconductor device array 100 after etching a portion of the hard mask layer 802 to form hard mask columns 902. FIG. 9B further depicts the hard mask columns 902 adjacent to each first column spacer sidewall 308. The figure further illustrates a plurality of double patterned column trenches 904, wherein the double patterned column trenches 904 exist between the hard mask columns 902 including the trenches occupied by the first column spacers 602.

FIGS. 10A, 10B, and 10C schematically depict semiconductor device array 100 from cross-sections A 102, B 104, and C 106, respectively. FIGS. 10A-10C illustrate semiconductor device array 100 after forming a filler layer 1002 over the CMOS cover layer 210, hard mask columns 902, and polish stop layer 204. FIG. 11B depicts the filler layer 1002 filling in the open double patterned column trenches 904. In this embodiment, the filler layer 1002 is of the same material as the first column spacers 602.

FIGS. 11A, 11B, and 11C schematically depict semiconductor device array 100 from cross-sections A 102, B 104, and C 106, respectively. FIGS. 11A-11C illustrate semiconductor device array 100 after planarizing the filler layer 1002.

FIGS. 12A, 12B, and 12C schematically depict semiconductor device array 100 from cross-sections A 102, B 104, and C 106, respectively. FIGS. 11A-11C illustrate semiconductor device array 100 after successively forming a row advanced patterning layer 1202 and row advanced patterning mask 1204 over the filler layer 1002. In this embodiment, the row advanced patterning layer 1202 is composed of a carbon material, and the row advanced patterning mask 1204 is composed of a low temperature oxide material.

FIGS. 13A, 13B, and 13C schematically depict semiconductor device array 100 from cross-sections A 102, B 104, and C 106, respectively. FIGS. 13A-13C illustrate semiconductor device array 100 after forming a row photoresist pattern 1302 over the row advanced patterning mask 1204 and etching a plurality of first row trenches 1304 through the row advanced patterning layer 1202. FIG. 13C further depicts first row columns 1306 including first row sidewalls 1308.

FIGS. 14A, 14B, and 14C schematically depict semiconductor device array 100 from cross-sections A 102, B 104, and C 106, respectively. FIGS. 14A-14C illustrate semiconductor device array 100 after removing the row advanced patterning layer 1202 and row advanced patterning mask 1204, and forming a first row spacer layer 1402.

FIGS. 15A, 15B, and 15C schematically depict semiconductor device array 100 from cross-sections A 102, B 104, and C 106, respectively. FIGS. 15A-15C illustrate semiconductor device array 100 after etching portions of the first row spacer layer 1402, resulting in first row spacers 1502. FIG. 15C further depicts the first row spacers 1502 including first row spacer sidewalls 1504.

Figure 16A:
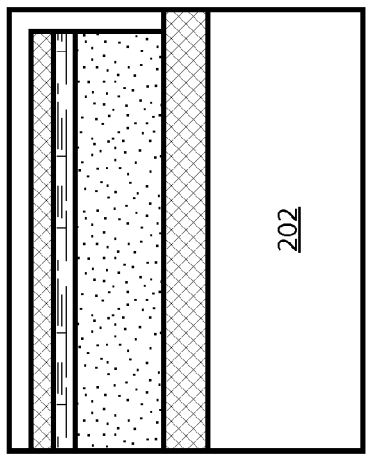
Figure 16B:
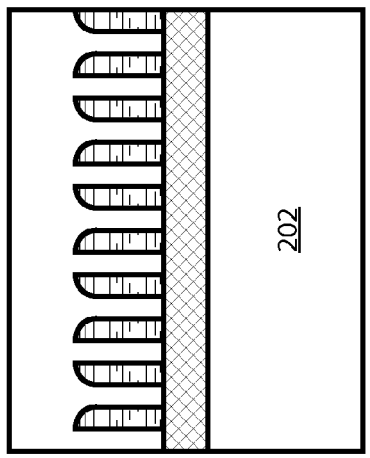
Figure 16C:
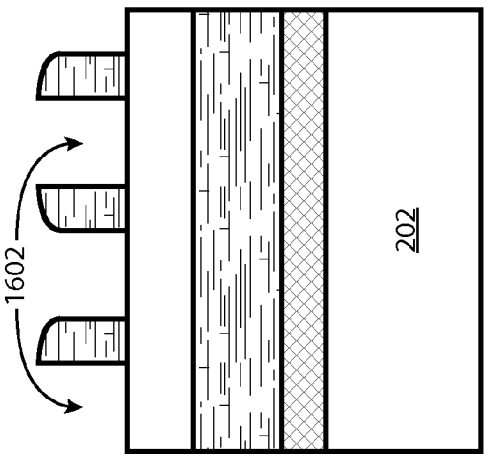

FIGS. 16A, 16B, and 16C schematically depict semiconductor device array 100 from cross-sections A 102, B 104, and C 106, respectively. FIGS. 16A-16C illustrate semiconductor device array 100 after removing the first row columns 1306, resulting in a plurality of second row trenches 1602.

Figure 17A:
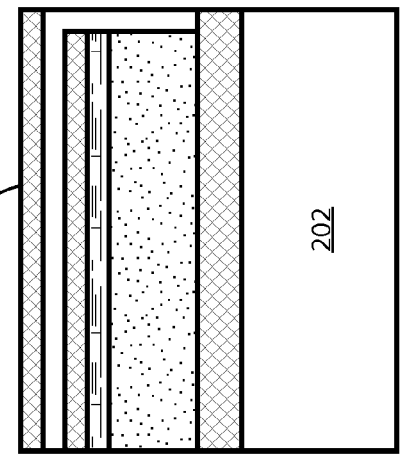
Figure 17B:
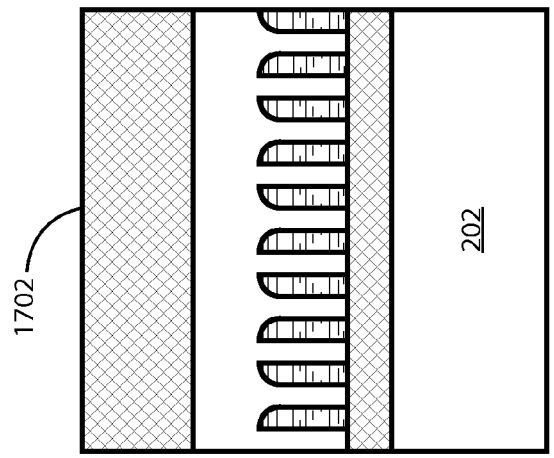
Figure 17C:
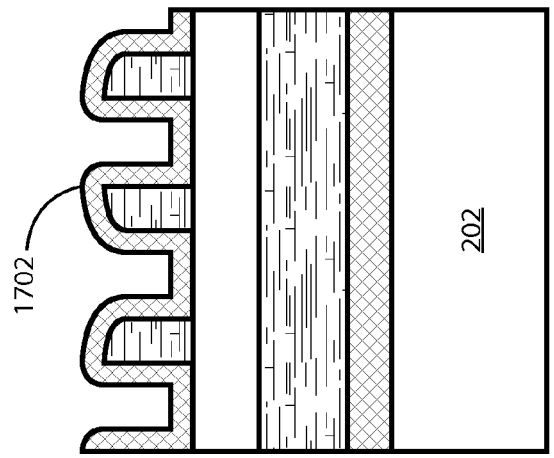

FIGS. 17A, 17B, and 17C schematically depict semiconductor device array 100 from cross-sections A 102, B 104, and C 106, respectively. FIGS. 17A-17C illustrate semiconductor device array 100 after forming a second row spacer layer 1702. In this embodiment, the second row spacer layer 1702 is composed of a silicon-nitride (SiN) material.

Figure 18A:
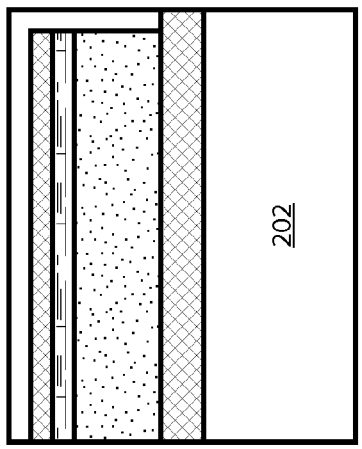
Figure 18B:
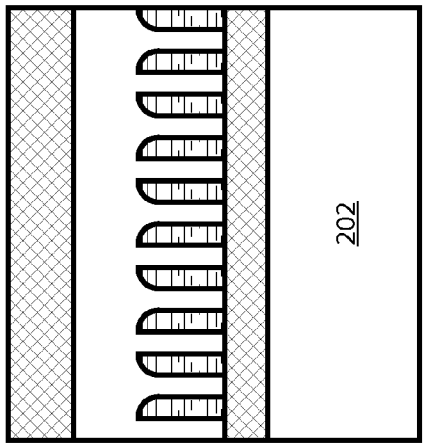
Figure 18C:
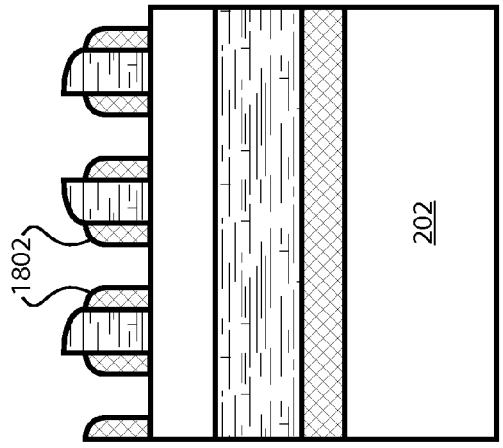

FIGS. 18A, 18B, and 18C schematically depict semiconductor device array 100 from cross-sections A 102, B 104, and C 106, respectively. FIGS. 18A-18C illustrate semiconductor device array 100 after etching a portion of the second row spacer layer 1702 to form a plurality of second row spacers 1802. FIG. 18C further depicts the second row spacers 1802 adjacent to each of the first row spacer sidewalls 1504.

Figure 19A:
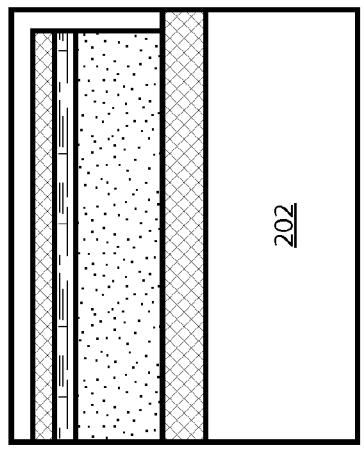
Figure 19B:
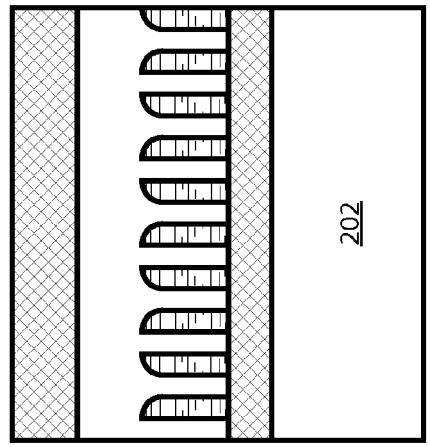
Figure 19C:
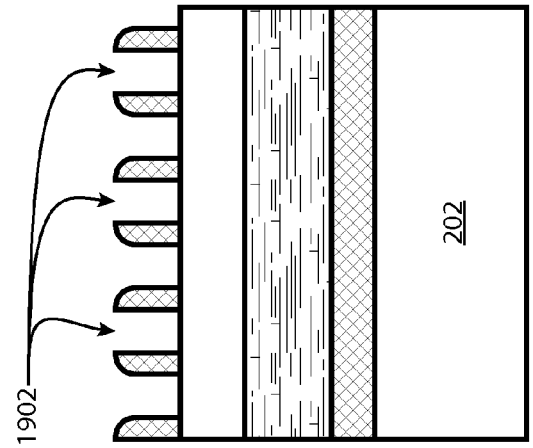

FIGS. 19A, 19B, and 19C schematically depict semiconductor device array 100 from cross-sections A 102, B 104, and C 106, respectively. FIGS. 19A-19C illustrate semiconductor device array 100 after removing the first row spacers 1502 to form third row trenches 1902. The first row trenches 1304, second row trenches 1602, and third row trenches 1902 result in a plurality of double patterned row trenches 2002 (not explicitly labeled in FIGS. 19A-19C).

Figure 20A:
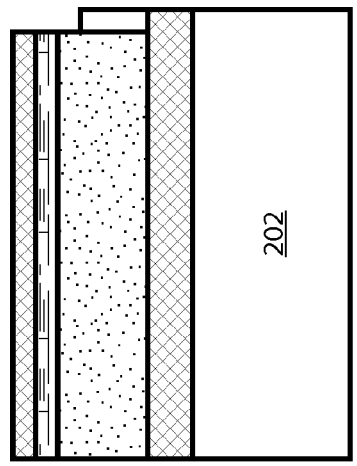
Figure 20B:
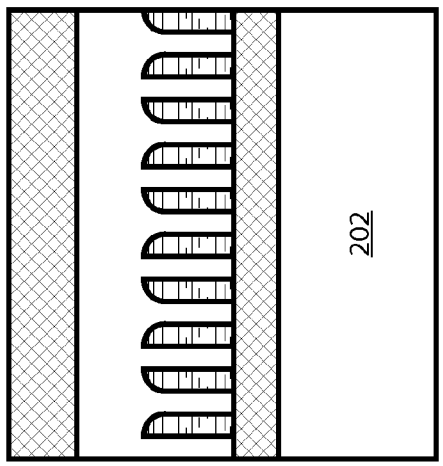
Figure 20C:
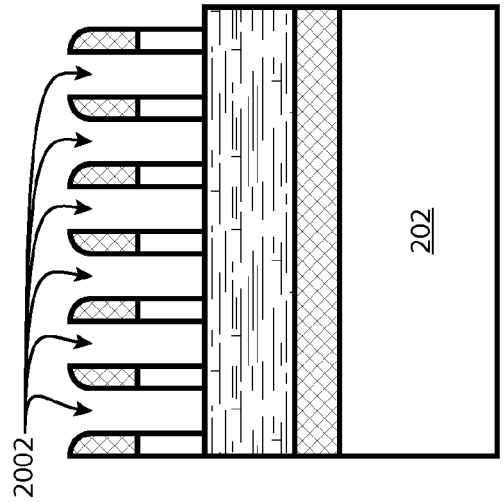

FIGS. 20A, 20B, and 20C schematically depict semiconductor device array 100 from cross-sections A 102, B 104, and C 106, respectively. FIGS. 20A-20C illustrate semiconductor device array 100 after etching the double patterned row trenches 2002 through a portion of the filler layer 1002. FIG. 20A further depicts the filler layer 1002 removed from the CMOS region 108, in the same etch process.

Figure 21A:
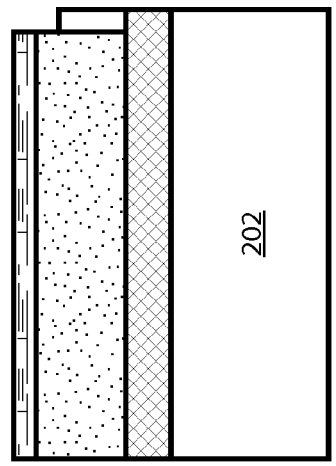
Figure 21B:
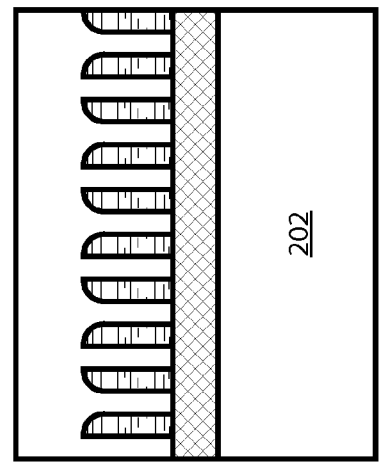
Figure 21C:
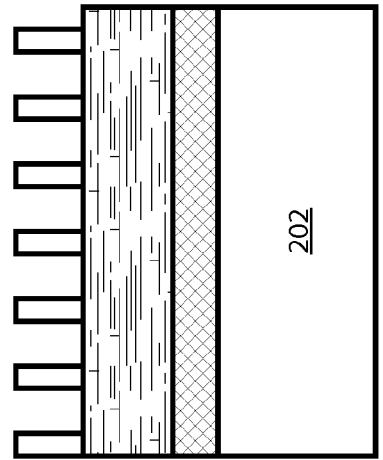

FIGS. 21A, 21B, and 21C schematically depict semiconductor device array 100 from cross-sections A 102, B 104, and C 106, respectively. FIGS. 21A-21C illustrate semiconductor device array 100 after removing the second row spacers 1802 with a selective etch process. FIG. 21A further depicts the CMOS cover layer 210 removed, in the same etch process.

FIGS. 22A, 22B, and 22C schematically depict semiconductor device array 100 from cross-sections A 102, B 104, and C 106, respectively. FIGS. 22A-22C illustrate semiconductor device array 100 after etching the double patterned row trenches 2002 through the hard mask columns 902 to form hard mask pillars 2302 and array trenches 2304 (not explicitly labeled in FIGS. 22A-22C). FIG. 22A further depicts the column advanced patterning mask 208 removed from the CMOS region 108, in the same etch process.

FIGS. 23A, 23B, and 23C schematically depict semiconductor device array 100 from cross-sections A 102, B 104, and C 106, respectively. FIGS. 23A-23C illustrate semiconductor device array 100 after removing the filler layer 1002 with a selective etch. FIGS. 23B and 23C further depict the hard mask pillars 2302 separated by the array trenches 2304.

FIGS. 24A, 24B, and 24C schematically depict semiconductor device array 100 from cross-sections A 102, B 104, and C 106, respectively. FIGS. 24A-24C illustrate semiconductor device array 100 after etching the array trenches 2304 down through the polish stop layer 204 and a portion of the substrate 202 to form a plurality of array pillars 2402.

FIGS. 25A, 25B, and 25C schematically depict semiconductor device array 100 from cross-sections A 102, B 104, and C 106, respectively. FIGS. 25A-25C illustrate semiconductor device array 100 after removing the hard mask pillars 2302 and removing the remaining column advanced patterning layer 206 from the CMOS region 108.

Figure 26C:
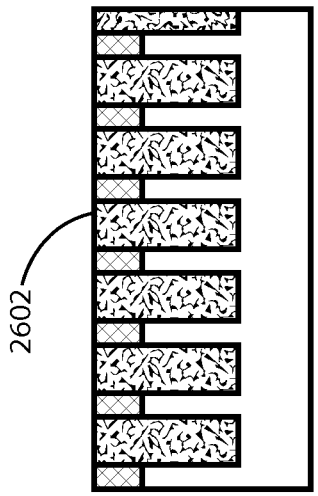
Figure 26B:
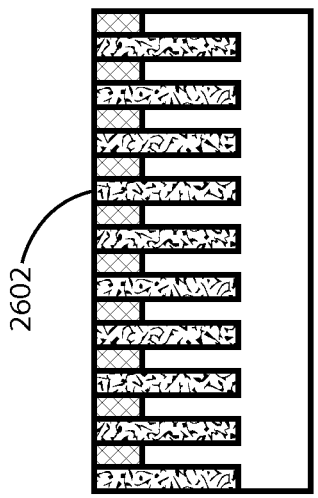
Figure 26A:
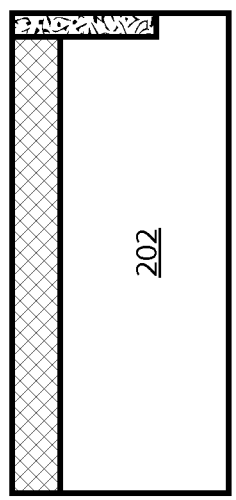

FIGS. 26A, 26B, and 26C schematically depict semiconductor device array 100 from cross-sections A 102, B 104, and C 106, respectively. FIGS. 26A-26C illustrate semiconductor device array 100 after forming a dopant layer 2602 within the array trenches 2304, and polishing the dopant layer 2602 and polish stop layer 204.

Figure 27C:
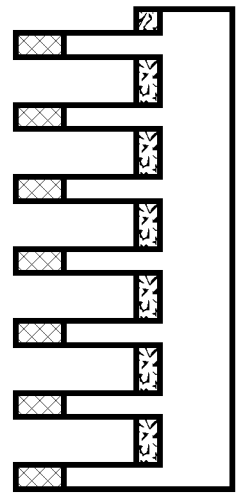
Figure 27B:
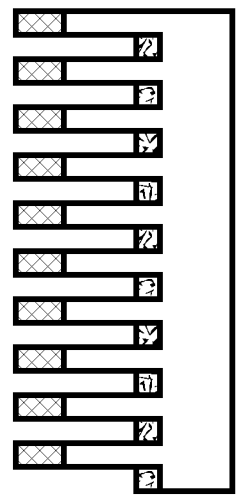
Figure 27A:
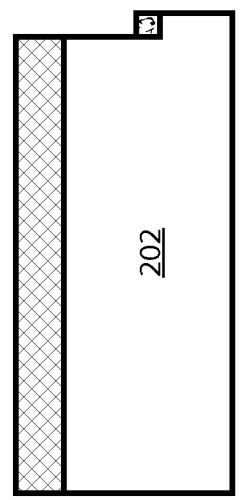

FIGS. 27A, 27B, and 27C schematically depict semiconductor device array 100 from cross-sections A 102, B 104, and C 106, respectively. FIGS. 27A-27C illustrate semiconductor device array 100 after recessing the dopant layer 2602 with a selective etch.

Figure 28C:
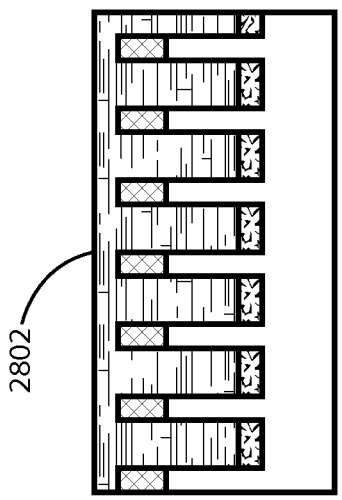
Figure 28B:
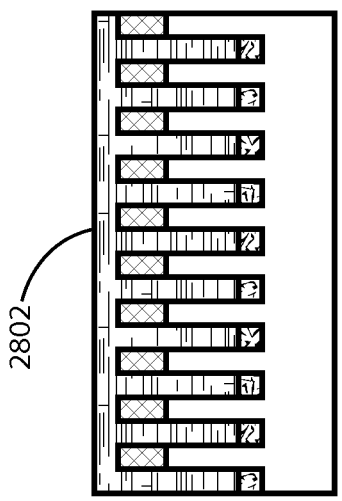
Figure 28A:
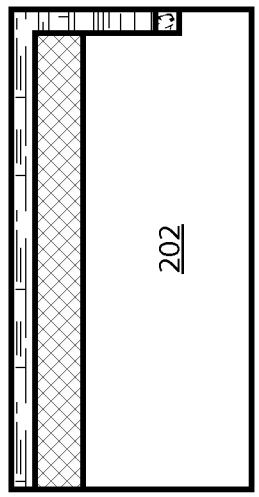

FIGS. 28A, 28B, and 28C schematically depict semiconductor device array 100 from cross-sections A 102, B 104, and C 106, respectively. FIGS. 28A-28C illustrate semiconductor device array 100 after forming an oxide cap 2802 over the dopant layer 2602 and polish stop layer 204. In this embodiment, the oxide cap 2802 is composed of a tetraethoxysilane (TEOS) material.

Figure 29C:
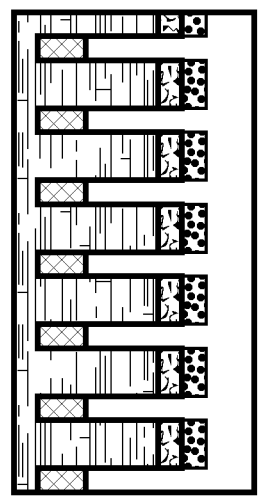
Figure 29B:
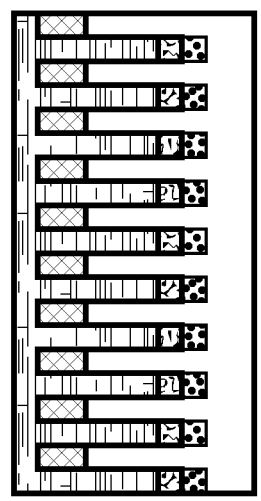
Figure 29A:
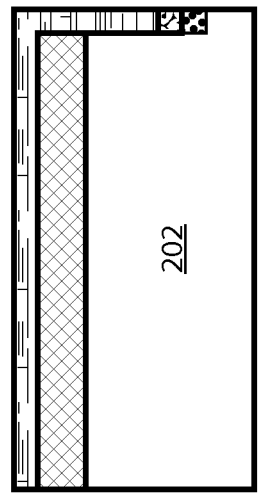

FIGS. 29A, 29B, and 29C schematically depict semiconductor device array 100 from cross-sections A 102, B 104, and C 106, respectively. FIGS. 29A-29C illustrate semiconductor device array 100 after driving the dopant layer 2602 material into a portion of the substrate 202.

Figure 30A:
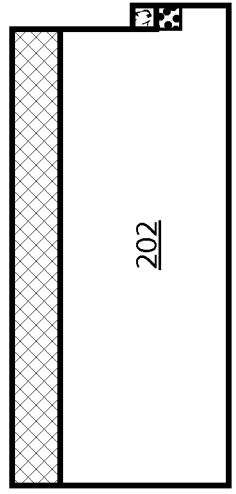
Figure 30B:
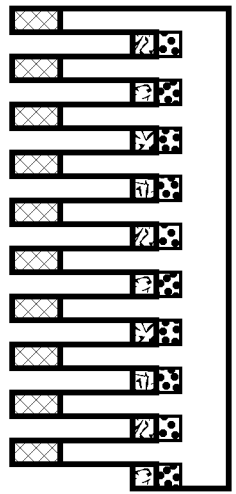
Figure 30C:
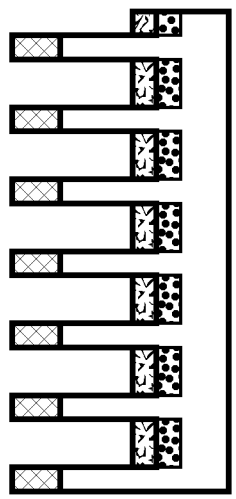

FIGS. 30A, 30B, and 30C schematically depict semiconductor device array 100 from cross-sections A 102, B 104, and C 106, respectively. FIGS. 30A-30C illustrate semiconductor device array 100 after removing the oxide cap 2802 with a selective etch process.

Figure 31A:
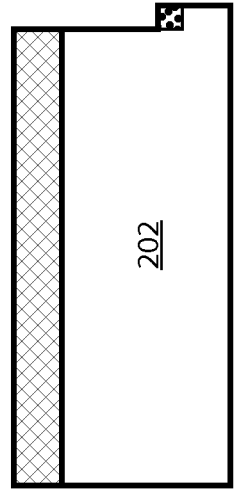
Figure 31B:
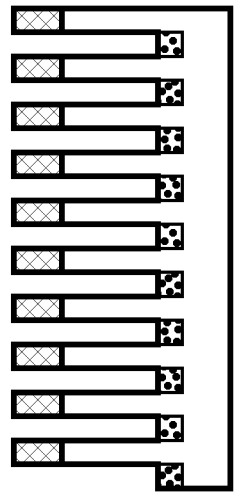
Figure 31C:
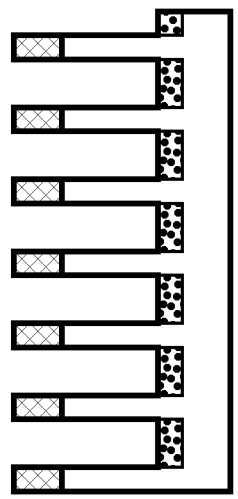
Figure 36:
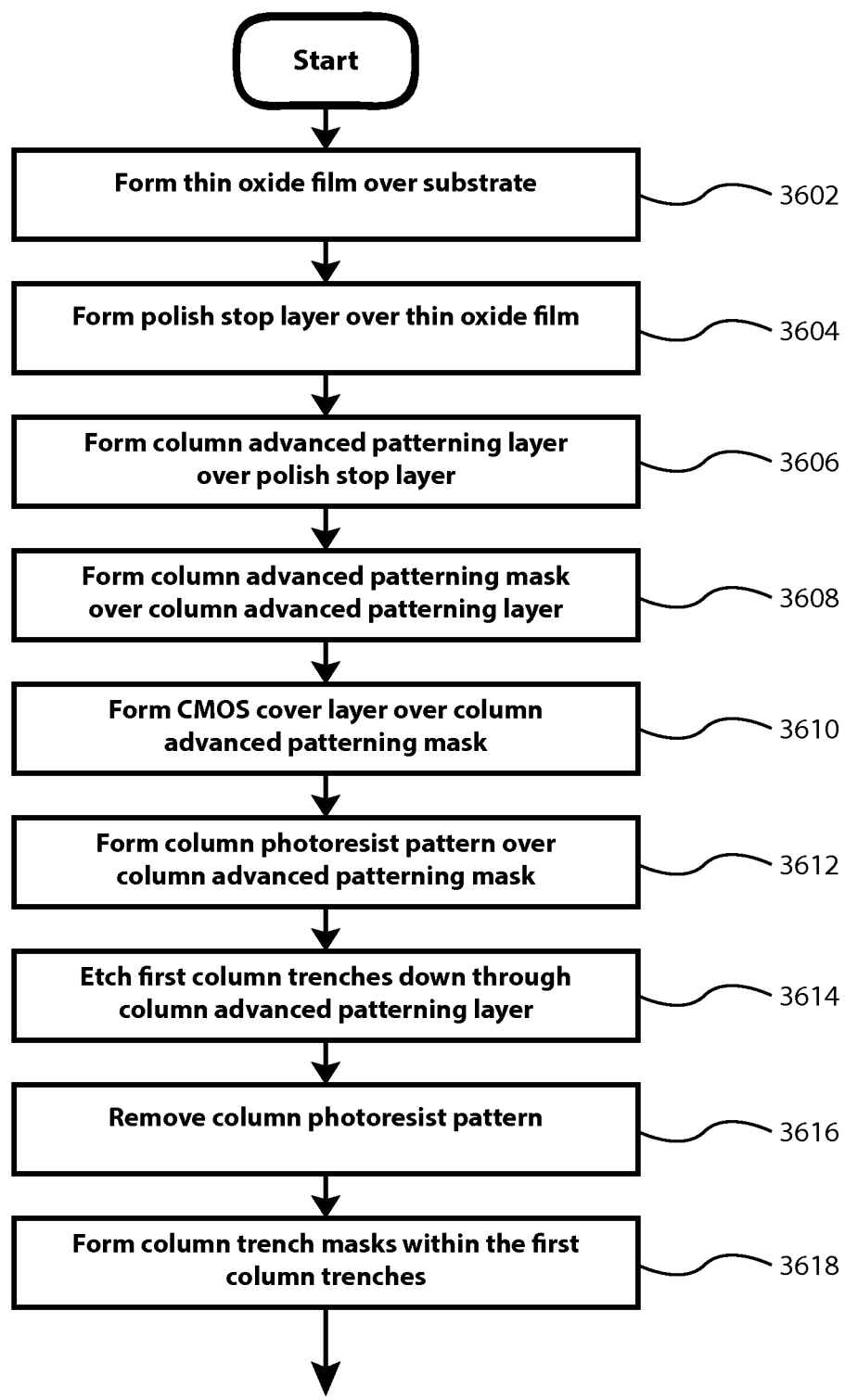
FIGS. 36 through 40 are flowcharts illustrating an example method for fabricating a semiconductor device array structure, in accordance to one embodiment of the present invention.
Figure 37:
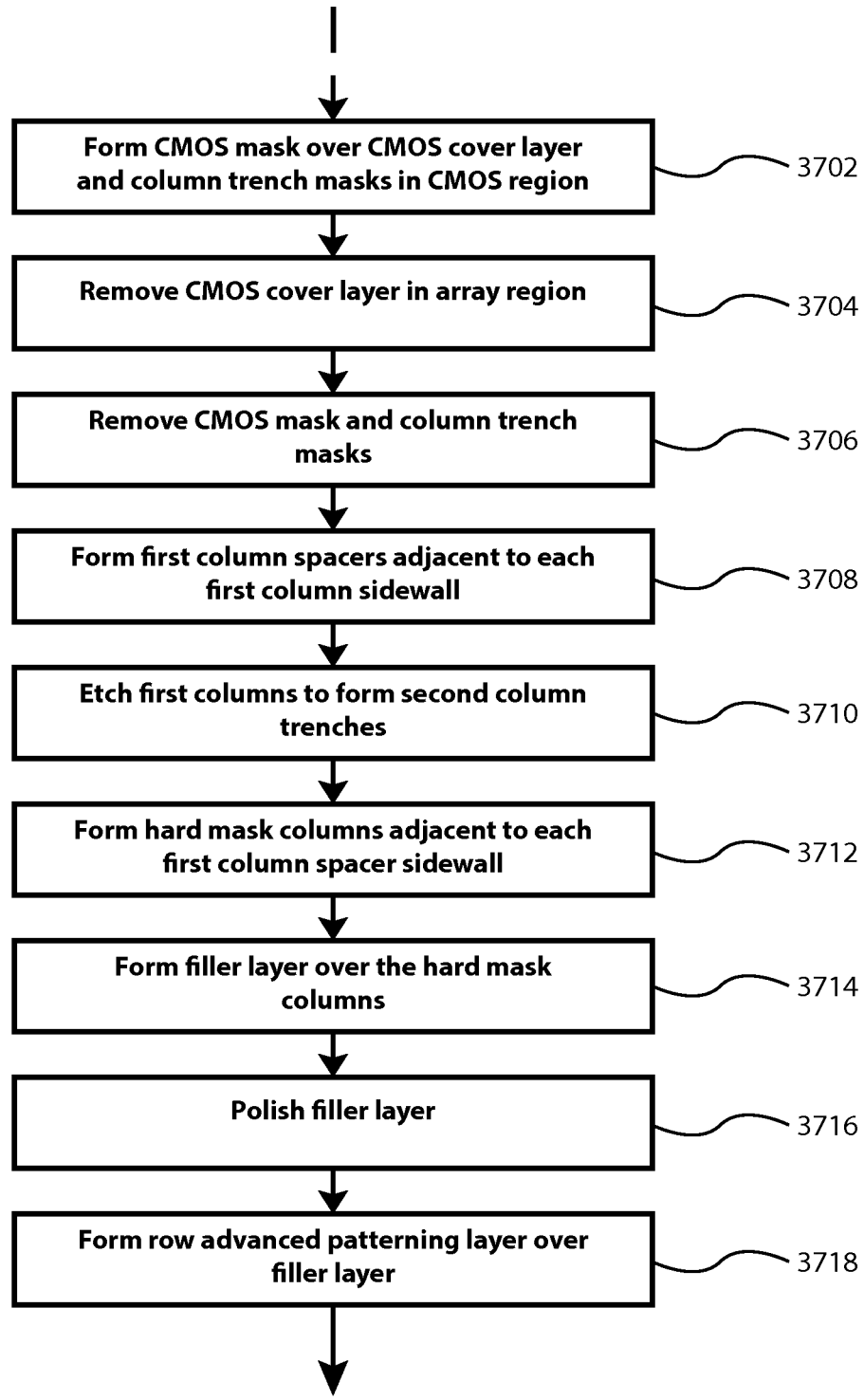
Figure 38:
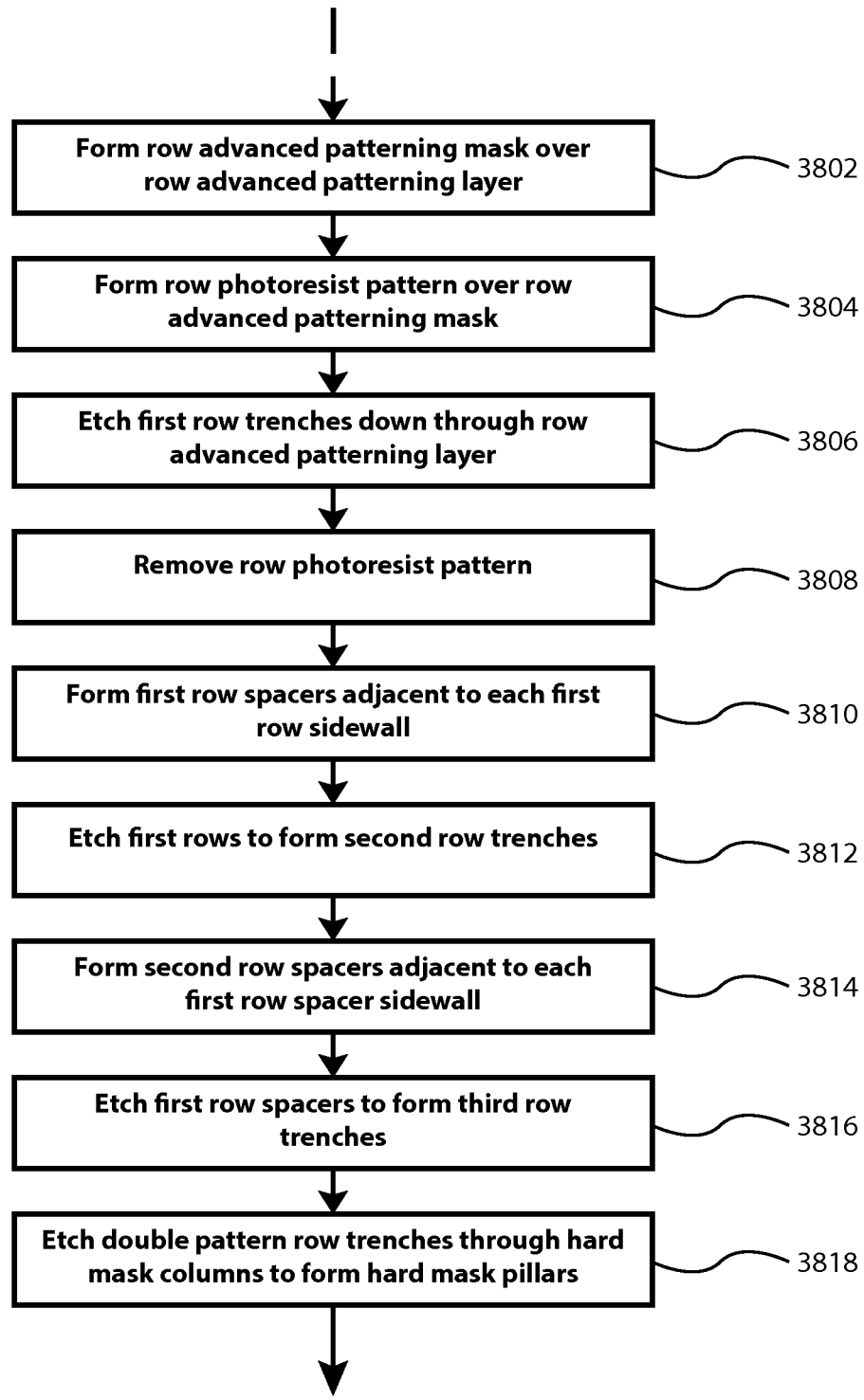
Figure 39:
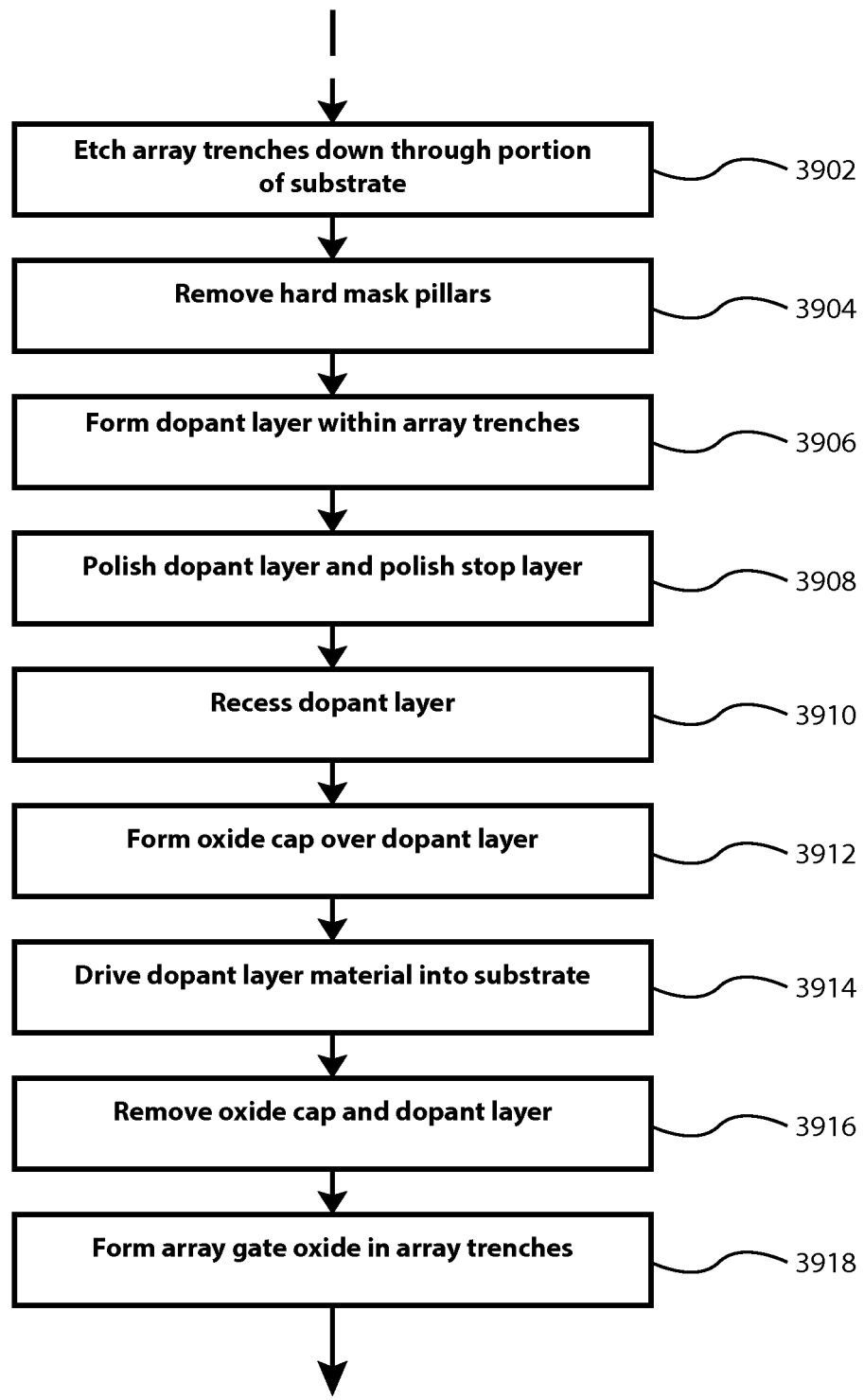
Figure 40:
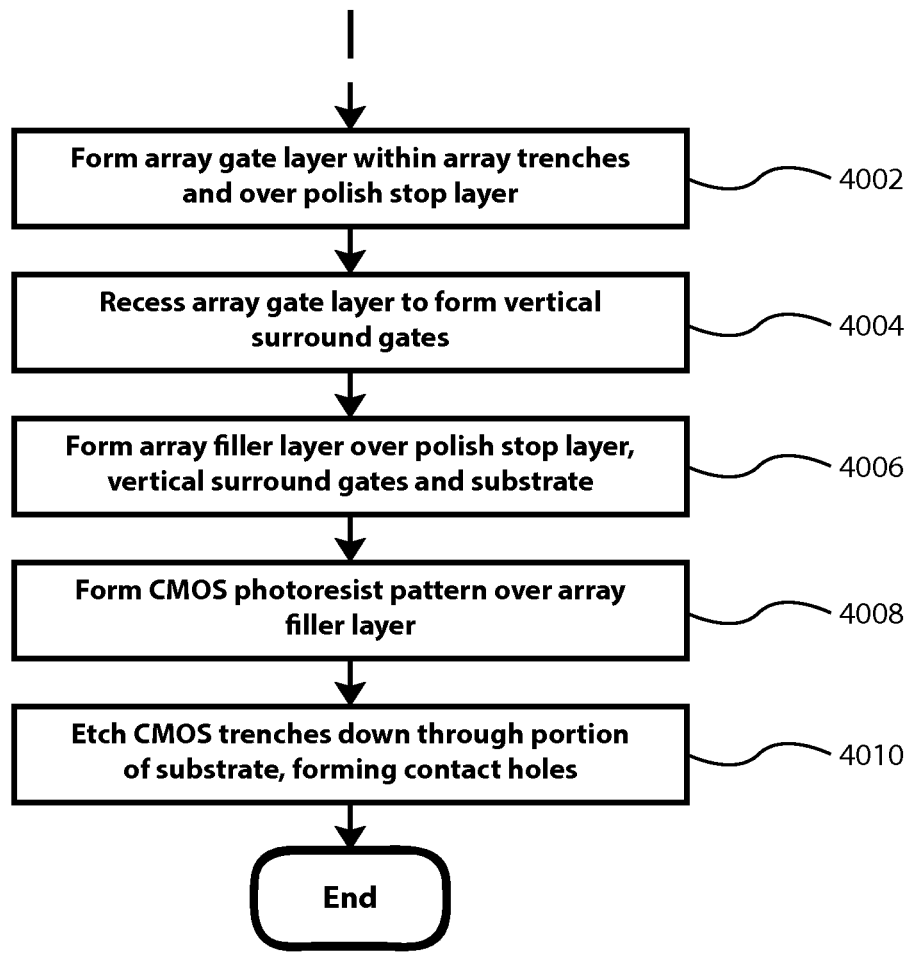

FIGS. 31A, 31B, and 31C schematically depict semiconductor device array 100 from cross-sections A 102, B 104, and C 106, respectively. FIGS. 31A-31C illustrate semiconductor device array 100 after removing the dopant layer 2602 with a selective etch process.

FIGS. 32A, 32B, and 32C schematically depict semiconductor device array 100 from cross-sections A 102, B 104, and C 106, respectively. FIGS. 32A-32C illustrate semiconductor device array 100 after forming a vertical surround gate layer 3202. In this embodiment, the vertical surround gate layer 3202 is composed of an arsenic silicon glass material.

FIGS. 33A, 33B, and 33C schematically depict semiconductor device array 100 from cross-sections A 102, B 104, and C 106, respectively. FIGS. 33A-33C illustrate semiconductor device array 100 after etching a portion of the vertical surround gate layer 3202 to form a plurality of vertical surround gates 3302.

FIGS. 34A, 34B, and 34C schematically depict semiconductor device array 100 from cross-sections A 102, B 104, and C 106, respectively. FIGS. 34A-34C illustrate semiconductor device array 100 after forming an array filler layer 3402 filling in the array trenches 2304, and forming a CMOS photoresist pattern 3404 over the array filler layer 3402. In this embodiment, the array filler layer 3402 is composed of a near frictionless carbon material. FIG. 34A further depicts a plurality of CMOS trenches 3406 in the CMOS photoresist pattern 3404 over the CMOS region 108. FIG. 34B further depicts a shared trench 3408 in the CMOS photoresist pattern 3404 over the array region 310 adjacent to the CMOS region 108.

FIGS. 35A, 35B, and 35C schematically depict semiconductor device array 100 from cross-sections A 102, B 104, and C 106, respectively. FIGS. 35A-35C illustrate semiconductor device array 100 after etching the CMOS trenches 3406 and shared trenches 3408 down through a portion of the substrate 202, and removing the array filler layer 3402 and CMOS photoresist pattern 3404. FIG. 35B further depicts the etch resulting in a plurality of contact holes 3502 below the shared trench 3408.

FIGS. 36-40 are flowcharts illustrating an example method for fabricating semiconductor array device 100 in accordance to one embodiment of the present invention. FIGS. 36-40 will be described with reference to FIGS. 2A-35C. The method begins with forming step 3602. At forming step 3602, a thin oxide film is deposited over a substrate 202. After forming step 3602, the method continues to forming step 3604. At forming step 3604, the polish stop layer 204 is deposited over the thin oxide film. After forming step 3604, the method continues to forming step 3606.

At forming step 3606, the column advanced patterning layer 206 is deposited over the polish stop layer 204. After forming step 3606, the method continues to forming step 3608. At forming step 3608, the column advanced patterning mask 208 is deposited over the column advanced patterning layer 206. After forming step 3608, the method continues to forming step 3610. At forming step 3610, the CMOS cover layer 210 is formed over the column advanced patterning mask 208 (FIGS. 2A-2C). In this embodiment, the CMOS cover layer 210 is composed of a selectively similar material to the polish stop layer 204. After forming step 3610, the method continues to forming step 3612.

At forming step 3612, the column photoresist pattern 302 is formed over the CMOS cover layer 210. After forming step 3612, the method continues to etching step 3614. At etching step 3614, the plurality of first column trenches 304 are etched through the CMOS cover layer 210, column advanced patterning mask 208, and column advanced patterning layer 206 (FIGS. 3A-3C). In one embodiment, wherein the CMOS cover layer 210 is comprised of a SiN material and the column advanced patterning mask 208 is comprised of a low temperature oxide material, the CMOS cover layer 210 and column advanced patterning mask 208 are etched in a single etch, utilizing a fluorine chemistry. In the aforementioned embodiment, the advanced patterning layer 206 is composed of a carbon material and is etched with an oxygen chemistry. The etch results in the plurality of first columns 306, each of the first columns 306 including at least one first column sidewall 308. After etching step 3614, the method continues to removing step 3616.

At removing step 3616, the column photoresist pattern 302 is removed. After removing step 3616, the method continues to forming step 3618. At forming step 3618, the plurality of column trench masks 402 are formed within the first column trenches 304. In this embodiment, the column trench masks 402 are formed utilizing a spin-on material to protect the polish stop layer 204 during the upcoming removal of the CMOS cover layer 210 in the array region. After forming step 3618, the method continues to forming step 3702. At forming step 3702, the CMOS mask 404 is formed over the CMOS cover layer 210 in the CMOS region 108. After forming step 3702, the method continues to removing step 3704. At removing step 3704, the CMOS cover layer 210 is removed from the array region 110 (FIGS. 4A-4C). In this embodiment, the CMOS cover layer 210 remains in the CMOS region 108, protecting the films below it during the subsequent patterning processes. One skilled in the art would recognize that the CMOS cover layer 210 can be removed with a variety of selective etch processes. After removing step 3704, the method continues to removing step 3706.

At removing step 3706, the CMOS mask 404 and column trench masks 402 are removed. After removing step 3706, the method continues to forming step 3708. At forming step 3708, the plurality of first column spacers 602 are formed adjacent to the first column sidewalls 308 (FIGS. 1 & 6A-6C). One skilled in the art would recognize that the first column spacers 602 can be formed with a variety of deposition and etch processes. After forming step 3708, the method continues to etching step 3710.

At etching step 3710, the first columns 306 are etched away to form the plurality of second column trenches 702 (FIGS. 7A-7C). After etching step 3710, the method continues to forming step 3712. At forming step 3712, the plurality of hard mask columns 902 are formed adjacent to the first column spacer sidewalls 604 (FIGS. 9A-9C). One skilled in the art would recognize that the hard mask columns 902 can be formed with a variety of deposition and etch processes. In this embodiment, the hard mask columns 902 are composed of the same material as the column advanced patterning mask 208. After forming step 3712, the method continues to forming step 3714.

At forming step 3714, the filler layer 1002 is formed over the hard mask columns 902 (FIGS. 10A-10C). In this embodiment, the filler layer 1002 is composed of the same material as the first column spacers 602. After forming step 3714, the method continues to polishing step 3716. At polishing step 3716, the filler layer 1002 is polished (FIGS. 11A-11C). In this embodiment, the polishing stops at the level of the CMOS cover layer 210. After polishing step 3716, the method continues to forming step 3718.

At forming step 3718, the row advanced patterning layer 1202 is formed over the filler layer 1002. In this embodiment, the row advanced patterning layer 1202 is composed of the same material as the column advanced patterning layer 206. After forming step 3718, the method continues to forming step 3802. At forming step 3802, the row advanced patterning mask 1204 is formed over the row advanced patterning layer 1202 (FIGS. 12A-12C). In this embodiment, the row advanced patterning mask 1204 is composed of the same material as the column advanced patterning mask 208 and hard mask columns 902. After forming step 3802, the method continues to forming step 3804.

At forming step 3804, the row photoresist pattern 1302 is formed over the row advanced patterning mask 1204. After forming step 3804, the method continues to etching step 3806. At etching step 3806, the plurality of first row trenches 1304 are etched through the row advanced patterning layer 1202 and row advanced patterning mask 1204 (FIGS. 13A-13C). The etch results in the plurality of first rows 1306, each of the first rows 1306 include at least one first row sidewall 1308. After etching step 3806, the method continues to removing step 3808.

At removing step 3808, the row photoresist pattern 1302 is removed. After removing step 3808, the method continues to forming step 3810. At forming step 3810, a plurality of first row spacers 1502 are formed adjacent to the first row sidewalls 1308 (FIGS. 15A-15C). One skilled in the art would recognize that the first row spacers 1502 can be formed with a variety of deposition and etch processes. After forming step 3810, the method continues to etching step 3812.

At etching step 3812, the first rows 1306 are etched away to form the plurality of second row trenches 1602 (FIGS. 16A-16C). After etching step 3812, the method continues to forming step 3814. At forming step 3814, the plurality of second row spacers 1802 are formed adjacent to the first row spacers 1502 (FIGS. 18A-18C). One skilled in the art would recognize that the second row spacers 1802 can be formed with a variety of deposition and etch processes. In this embodiment, the second row spacers 1802 are composed of the same material as the CMOS cover layer 210 and polish stop layer 204. After forming step 3814, the method continues to etching step 3816.

At etching step 3816, the first row spacers 1502 are etched away to form the plurality of third row trenches 1902 (FIGS. 19A-19C). The first, second and third row 1304/1602/1902 trenches result in double patterned row trenches 2002. In this embodiment, the double patterned row trenches 2002 have a greater width than the double patterned column trenches 904. After etching step 3816, the method continues to etching step 3818. At etching step 3818, the double patterned row trenches 2002 are etched down through the hard mask columns 902, to form the plurality of hard mask pillars 2302 and array trenches 2304 (FIGS. 22A-22C). In this embodiment, the second row spacers 1802 are removed with a selective etch after etching through the filler layer 1002. During the selective etch, the remaining CMOS cover layer 210 in the CMOS region 108 is also removed. Also in this embodiment, the remaining column advanced patterning mask 208 in the CMOS region 108 is removed while etching the hard mask columns 902. Furthermore, in this embodiment, the filler layer 1002 is removed after forming the hard mask pillars 2302. One skilled in the art would recognize that a variety of reactive ion etch (RIE) processes and selective etch processes can be utilized in the aforementioned etches. After etching step 3818, the method continues to etching step 3902.

At etching step 3902, the array trenches 2304 are etched down through the polish stop layer 204 and a portion of the substrate 202 to form array pillars 2402 (FIGS. 24A-24C). One skilled in the art would recognize that a reactive ion etch (RIE) process can be utilized to form the array pillars 2402. After etching step 3902, the method continues to removing step 3904. At removing step 3904, the hard mask pillars 2302 are removed with a selective etch (FIGS. 25A-25C). One skilled in the art would recognize that a variety of selective etch processes can be utilized to remove the hard mask pillars 2302, such as a Hydrogen Flouride (HF) wet etch. After removing step 3904, the method continues to forming step 3906.

At forming step 3906, the dopant layer 2602 is formed over the array pillars 2402, filling the array trenches 2304. After forming step 3906, the method continues to polishing step 3908. At polishing step 3908, the dopant layer 2602 and polish stop layer 204 are polished to form a planarized surface across the CMOS region 108 and array region 210 (FIGS. 26A-26C). After polishing step 3908, the method continues to recessing step 3910.

At recessing step 3910, the dopant layer 2602 is recessed into the array trenches 2304 (FIGS. 27A-27C). One skilled in the art would recognize that a variety of selective etches can be utilized to recess the dopant layer 2602. After recessing step 3910, the method continues to forming step 3912. At forming step 3912, the oxide cap 2802 is formed over the dopant layer 2602 and array pillars 2402 (FIGS. 28A-28C). After forming step 3912, the method continues to driving step 3914.

At driving step 3914, the dopant layer 2602 material is driven into a portion of the substrate 202 (FIGS. 29A-29C). One skilled in the art would recognize that the dopant layer 2602 material can be driven in to the substrate 202 utilizing a variety of processes, such as an annealing process. After driving step 3914, the method continues to removing step 3916. At removing step 3916, the oxide cap 2802 and dopant layer 2602 are removed (FIGS. 30A-31C). One skilled in the art would recognize that the oxide cap 2802 and dopant layer 2602 can be removed by a variety of successive etches. After removing step 3916, the method continues to forming step 3918.

At forming step 3918, an array gate oxide (not shown in figures) is formed within the array trenches 2304. In one embodiment, the array gate oxide rounds the corners of the array pillars. After forming step 3918, the method continues to forming step 4002. At forming step 4002, the vertical surround gate layer 3202 is formed within the array trenches 2304 (FIGS. 32A-32C). One skilled in the art would recognize that a variety of conformal deposition processes can be utilized to form the vertical surround gate layer 3202. In this embodiment, the vertical surround gate layer 3202 thickness results in the double patterned column trenches 904 to be filled, while the double patterned row trenches 2002 maintain a gap. After forming step 4002, the method continues to recessing step 4004.

At recessing step 4004, the vertical surround gate layer 3202 is recessed into the array trenches 2304 to form the vertical surround gates 3302 (FIGS. 33A-33C). One skilled in the art would recognize that a variety of selective etches can be utilized to recess the vertical surround gate layer 3202. After recessing step 4004, the method continues to forming step 4006.

At forming step 4006, the array filler layer 3402 is formed over the CMOS region 108 and array region 110. In this embodiment, the array filler layer 3402 fills in the array trenches 2304 to provide a flat surface for the upcoming photoresist pattern. After the forming step 4006, the method continues to forming step 4008. At forming step 4008, the CMOS photoresist pattern 3404 is formed over the array filler layer 3402 (FIGS. 34A-34C). The CMOS photoresist pattern 3404 includes CMOS trenches 3406 in the CMOS region 108, and the shared trench 3408 in the array region 110. After forming step 4008, the method continues to etching step 4010.

At etching step 4010, CMOS trenches 3406 are etched down through the array filler layer 3402, polish stop layer 204, and a portion of the substrate 202, in the CMOS region 108 (FIGS. 35A-35C). One skilled in the art would recognize that etching the CMOS trenches 3406 down to the substrate 202 can be accomplished utilizing a variety of successive etches. The etch further forms contact holes 3502 in a portion of the substrate 202 below the shared trench 3408. After etching step 4010, the method is complete. In ideal embodiments, this method is proceeded by conventional CMOS fabrication processes.

Having described preferred embodiments for a method of fabricating a semiconductor device array with vertical surround gate structures, it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
    forming a polish stop layer over a substrate, the substrate including a CMOS region and an array region;
    forming a plurality of patterning layers over the polish stop layer;
    forming a CMOS cover layer over the patterning layers in the CMOS region;
    forming a plurality of array pillars over the array region, the array pillars separated by a plurality of array trenches, wherein forming the array pillars includes removing the CMOS cover layer and the patterning layers;
    planarizing the polish stop layer after forming the array pillars and array trenches;
    doping portions of the substrate within the array trenches;
    forming a plurality of vertical surround gates in the array trenches, the vertical surround gates surrounding the array pillars;
    forming an array filler layer over the polish stop layer, the vertical surround gates, and the substrate;
    forming a CMOS photoresist pattern over the array filler layer, the CMOS photoresist pattern including a plurality of CMOS trenches in the CMOS region, and a shared trench in the array region; and
    etching the CMOS trenches in the CMOS region through a portion of the substrate such that the array pillars under the shared trench are also etched to form a plurality of contact holes.

2. The method of claim 1, wherein:
    the polish stop layer is comprised of a silicon nitride material;
    the CMOS cover layer is comprised of a silicon nitride material;
    the vertical surround gates are comprised of a polycrystalline silicon material; and
    the array filler layer is comprised of a near frictionless carbon material.

3. The method of claim 1, wherein forming a plurality of array pillars further comprises:
    forming a plurality of column patterning layers, the column patterning layers include a column advanced patterning mask and a column advanced patterning layer;
    forming a plurality of first column trenches through the column patterning layers and CMOS cover layer within the array region, the first column trenches separated by a plurality of first columns, and wherein the first columns each include at least one first column sidewall;
    forming a plurality of column trench masks within the first column trenches;
    forming a CMOS mask over the CMOS region;
    removing the CMOS cover layer within the array region;
    removing the CMOS mask and column trench masks;
    forming a plurality of hard mask columns over the polish stop layer in the array region, the hard mask columns including double patterned column trenches;

forming a filler layer over the hard mask columns such that the filler layer fills the double patterned column trenches, and wherein the filler layer is planarized;

forming a plurality of double patterned row trenches through the filler layer in the array region, wherein the process of forming the double patterned row trenches includes removing the filler layer in the CMOS region and removing the CMOS cover layer;

etching the double patterned row trenches through the hard mask columns to form a plurality of hard mask pillars, the hard mask pillars separated by the array trenches, and wherein the etch also removes the column advanced patterning mask; and etching the array trenches through the polish stop layer and a portion of the substrate to form the array pillars.

4. The method of claim 3, wherein:
the column advanced patterning layer is comprised of a carbon material;
the column advanced patterning mask is comprised of a low temperature oxide film;
the hard mask columns and the hard mask pillars are comprised of a silicon oxide material.

5. The method of claim 3, wherein forming a plurality of first column trenches further comprises:
forming a column photoresist pattern over the column patterning layers, the column photoresist pattern including a plurality of first column trenches in the array region;
etching the first column trenches through the CMOS cover layer, column advanced patterning mask, and column advanced patterning layer, the first column trenches separated by a plurality of first columns; and
removing the column photoresist pattern.

6. The method of claim 3, wherein forming the plurality of hard mask columns further comprises:
forming a plurality of first column spacers within the first column trenches such that each first column sidewall is adjacent to one of the first column spacers, and wherein each of the first column spacers includes at least one first column spacer sidewall;
forming a plurality of second column trenches by selectively removing the column patterning layers within the array region, wherein the first column trenches and second column trenches form the double patterned column trenches;
forming the hard mask columns within the double patterned column trenches such that each first column spacer sidewall is adjacent to one of the hard mask columns.

7. The method of claim 6, wherein the first column spacers are comprised of a silicon material.

8. The method of claim 3, wherein forming the plurality of double patterned row trenches further comprises:
forming a plurality of row patterning layers over the filler layer, the row patterning layers including a row advanced patterning layer and a row advanced patterning mask;
forming a plurality of first row trenches through the row advanced patterning mask and row advanced patterning layer, the first row trenches separated by a plurality of first rows, and wherein each of the first rows includes at least one first row sidewall;
forming a plurality of first row spacers within the first row trenches such that each of the first row sidewalls is adjacent to at least one of the first row spacers, and wherein each of the first row spacers includes at least one first row spacer sidewall;
forming a plurality of second row trenches by selectively removing the row advanced patterning layer, and row advanced patterning mask, wherein the first row trenches and second row trenches form a plurality of double patterned row trenches;
forming a plurality of second row spacers adjacent to each of the first row spacer sidewalls, wherein each of the first row spacer sidewalls is adjacent to at least one of the second row spacers; and
forming a plurality of third row trenches by selectively removing the first row spacers, wherein the first, second, and third row trenches result in the double patterned row trenches.

9. The method of claim 8, wherein:
the row advanced patterning layer is comprised of a carbon material;
the row advanced patterning mask is comprised of a low temperature oxide film;
the first row spacers are comprised of a silicon oxide material; and
the second row spacers are comprised of a silicon nitride material.

10. The method of claim 3, further comprising:
removing the filler layer after forming the array trenches; and
removing the hard mask pillars and column advanced patterning layer after forming the array pillars.

11. The method of claim 3, wherein doping portions of the substrate further comprises:
forming a dopant layer within the array trenches;
recessing the dopant layer, after planarizing the dopant layer and polish stop layer;
forming an oxide cap over the dopant layer;
driving the dopant layer material into the substrate; and
removing the oxide cap and dopant layer, after driving the dopant layer material into the substrate.

12. The method of claim 11, wherein:
the dopant layer is comprised of an arsenic silicon glass material; and
the oxide cap is comprised of a tetraethoxysilane material.

13. The method of claim 1, wherein forming the plurality of vertical surround gates further comprises:
forming an array gate layer over the polish stop layer and within the array trenches; and
recessing the array gate layer to form the vertical surround gates.

14. The method of claim 1, further comprising forming a thin oxide film over the substrate prior to the polish stop layer.

15. The method of claim 1, further comprising forming an array gate oxide in the array trenches to round corners of the array pillars.

* * * * *